United States Patent
Lee et al.

(10) Patent No.: US 12,301,354 B2
(45) Date of Patent: May 13, 2025

(54) SYSTEM ARCHITECTURE OF NETWORK CODING AT USER PLANE FUNCTION

(71) Applicant: QUALCOMM Incorporated, San Diego, CA (US)

(72) Inventors: Hyun Yong Lee, San Diego, CA (US); Prashanth Haridas Hande, San Diego, CA (US); Peerapol Tinnakornsrisuphap, San Diego, CA (US); Dario Serafino Tonesi, San Diego, CA (US); Miguel Griot, La Jolla, CA (US); Yih-Hao Lin, San Diego, CA (US); Sanket Sanjay Kalamkar, San Diego, CA (US); Mickael Mondet, Louannec (FR); Diana Maamari, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 18/458,966

(22) Filed: Aug. 30, 2023

(65) Prior Publication Data
US 2025/0080272 A1    Mar. 6, 2025

(51) Int. Cl.
*H04L 1/00* (2006.01)
*H03M 13/11* (2006.01)

(52) U.S. Cl.
CPC ........... *H04L 1/0061* (2013.01); *H03M 13/11* (2013.01); *H04L 1/0064* (2013.01)

(58) Field of Classification Search
CPC ..... H04L 1/0061; H04L 1/0064; H03M 13/11
See application file for complete search history.

(56) References Cited

U.S. PATENT DOCUMENTS

2016/0262132 A1* 9/2016 Liberg .................. H04W 72/20
2016/0365947 A1* 12/2016 Roberts ............... H03M 13/373
(Continued)

FOREIGN PATENT DOCUMENTS

| WO | 2022037097 A1 | 2/2022 |
| WO | 2022155977 A1 | 7/2022 |
| WO | 2023088372 A1 | 5/2023 |

OTHER PUBLICATIONS

J. Sydir et al., "DPM-NFV: Dynamic Power Management Framework for 5G User Plane Function using Bayesian Optimization," Globecom 2022—2022 IEEE Global Communications Conference, Rio de Janeiro, Brazil, 2022, pp. 4099-4105, (Year: 2022).*

(Continued)

*Primary Examiner* — Cynthia Britt
(74) *Attorney, Agent, or Firm* — QUALCOMM Incorporated

(57) ABSTRACT

The apparatus may be configured to generate, for a set of data packets associated with an application, a set of parity bits, generate an encoded data transmission associated with a UPF including the set of data packets and the generated set of parity bits, and to output, for a receiving device associated with the application, the encoded data transmission. The apparatus may be configured to obtain an encoded data transmission associated with a UPF including a first plurality of bits associated with a set of data packets associated with an application and a second plurality of bits associated with a set of parity bits based on the set of data packets, to decode the encoded data transmission to generate the set of data packets, and output, for one of an application client or an application server associated with the application, the set of data packets.

30 Claims, 18 Drawing Sheets

(56) References Cited

U.S. PATENT DOCUMENTS

| | | | |
|---|---|---|---|
| 2018/0270668 A1* | 9/2018 | Nair | H04W 76/10 |
| 2019/0140784 A1* | 5/2019 | Xi | H03M 13/2942 |
| 2023/0066111 A1* | 3/2023 | Yang | H04L 5/0053 |

OTHER PUBLICATIONS

International Search Report and Written Opinion—PCT/US2024/043107—ISA/EPO—Nov. 27, 2024.

* cited by examiner

SYSTEM ARCHITECTURE OF NETWORK CODING AT USER PLANE FUNCTION

TECHNICAL FIELD

The present disclosure relates generally to communication systems, and more particularly, to a network coding architecture for encoding associated sets of network packets.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be an element associated with a transmitting device such as an element of a wireless device or user equipment (UE) or an element of a network such as a user plane function (UPF). The apparatus may be configured to generate, for a set of data packets associated with an application, a set of parity bits and generate an encoded data transmission associated with a UPF including the set of data packets and the generated set of parity bits. The apparatus may further be configured to output, for a receiving device associated with the application, the encoded data transmission.

In an aspect of the disclosure, a method, a computer-readable medium, and an apparatus are provided. The apparatus may be an element associated with a receiving device such as an element of a wireless device or UE or an element of a network such as a UPF. The apparatus may be configured to obtain an encoded data transmission associated with a UPF including a first plurality of bits associated with a set of data packets associated with an application and a second plurality of bits associated with a set of parity bits based on the set of data packets. The apparatus may further be configured to decode the encoded data transmission to generate the set of data packets based on the first plurality of bits and the second plurality of bits and output, for one of an application client or an application server associated with the application, the set of data packets.

To the accomplishment of the foregoing and related ends, the one or more aspects may include the features hereinafter fully described and particularly pointed out in the claims. The following description and the drawings set forth in detail certain illustrative features of the one or more aspects. These features are indicative, however, of but a few of the various ways in which the principles of various aspects may be employed.

DETAILED DESCRIPTION

Figure 1:
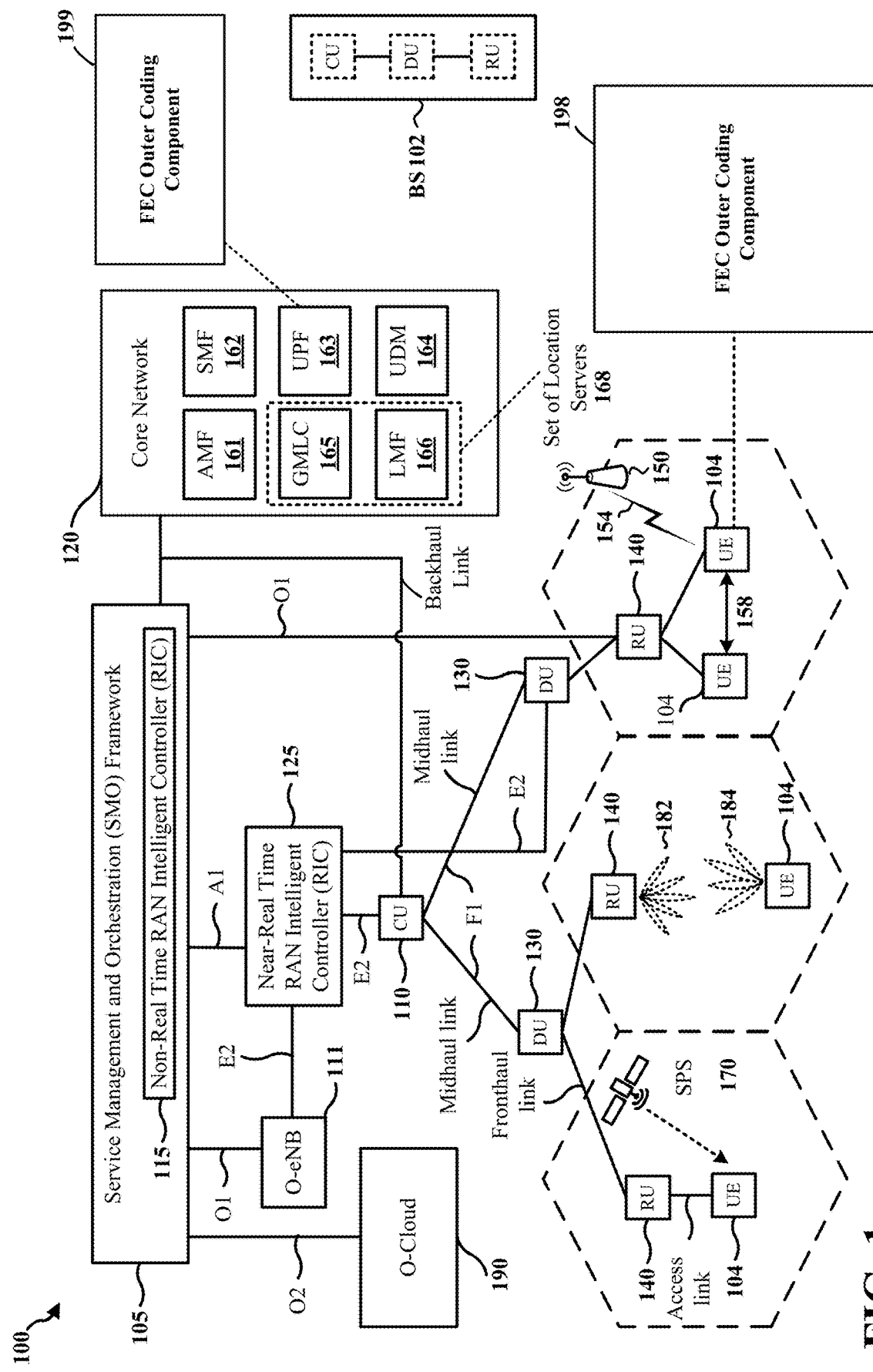
FIG. 1 is a diagram illustrating an example of a wireless communications system and an access network.

In some aspects of wireless communication, particular applications may have tight latency and/or power consumption thresholds. For example, an extended reality (XR) application may be associated with a packet data unit (PDU) set or burst to be delivered within a tight delay budget (e.g., 10 ms) and with a power consumption (e.g., <1 W) of augmented reality (AR) glasses. For such applications, one or more retransmissions (e.g., associated with an automatic repeat request (ARQ), or hybrid ARQ (HARQ)) may be used to correct a detected packet error, but the retransmission (reTx) may increase the latency and/or the power consumption due to its long turn-around time (e.g., TMO Sub-6: HARQ turn-around time≈7 ms; radio link control (RLC) reTx≈35 ms). Forward error correction (FEC) outer coding, in some aspects, may be used to avoid a retransmission procedure by transmitting redundant parity symbols. By avoiding retransmissions, the use of FEC may thus improve the latency and/or the power consumption. In some aspects, this FEC outer coding utilizes radio area network (RAN) related information to optimize the performance. Accordingly, applying an outer coding at the RAN may be a straightforward design option, however, a 5G RAN, in some aspects, may have limited capacity such that it would be hard to process the FEC outer coding due to its limited processing capability.

In some aspects of wireless communication, some applications may be associated with data transmitted in groups of data packets (e.g., groups of internet protocol (IP) packets). For example, an XR application may consume data in packet data unit (PDU) sets that may be associated with a smallest unit of data for the XR application and may be further grouped into a burst of PDU sets that may be associated with a same threshold time. For example, a burst of PDU sets may be associated with a single video frame or slice of a video frame that are used at a same time (e.g., the threshold time).

Various aspects relate generally to an FEC outer coding applied at a UPF. Some aspects more specifically relate to FEC coding for a PDU set or a burst of PDU sets. In some examples, a transmitting device may for a set of data packets associated with an application, generate a set of parity bits, generate an encoded data transmission associated with a UPF including the set of data packets and the generated set of parity bits and may output, for a receiving device associated with the application, the encoded data transmission. A receiving device may obtain the encoded data transmission associated with the UPF including a first plurality of bits associated with a set of data packets associated with an application and a second plurality of bits associated with a set of parity bits based on the set of data packets, decode the encoded data transmission to generate the set of data packets based on the first plurality of bits and the second plurality of bits and output the set of data packets for one of an application client or an application server associated with the application.

Particular aspects of the subject matter described in this disclosure can be implemented to realize one or more of the following potential advantages. In some examples, by applying the FEC outer coding in association with a UPF, the described techniques can be used to improve latency and/or power consumption (e.g., for an XR application).

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. When multiple processors are implemented, the multiple processors may perform the functions individually or in combination. Examples of processors include microprocessors, microcontrollers, graphics processing units (GPUS), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can include a random-access memory (RAM), a read-only memory (ROM), an electrically erasable programmable ROM (EE-PROM), optical disk storage, magnetic disk storage, other magnetic storage devices, combinations of the types of computer-readable media, or any other medium that can be used to store computer executable code in the form of instructions or data structures that can be accessed by a computer.

While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmission reception point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUS)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUS 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit-User Plane (CU-UP)), control plane functionality (i.e., Central Unit-Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending, at least in part, on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (IFFT), digital beamforming, physical random access channel (PRACH) extraction and filtering, or the like), or both, based at least in part on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via 01) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base station 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base station 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth™ (Bluetooth is a trademark of the Bluetooth Special Interest Group (SIG)), Wi-Fi™ (Wi-Fi is a trademark of the Wi-Fi Alliance) based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHZ-7.125 GHZ) and FR2 (24.25 GHz-52.6 GHZ). Although a portion of FR1 is greater than 6 GHZ, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHZ-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHZ-24.25 GHZ). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHZ-71 GHZ), FR4 (71 GHZ-114.25 GHZ), and FR5 (114.25 GHZ-300 GHz). Each of these higher frequency bands falls within the EHF band.

With the above aspects in mind, unless specifically stated otherwise, the term "sub-6 GHz" or the like if used herein may broadly represent frequencies that may be less than 6 GHZ, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a TRP, network node, network entity, network equipment, or some other suitable terminology. The base station 102 can be implemented as an integrated access and backhaul (IAB) node, a relay node, a sidelink node, an aggregated (monolithic) base station with a baseband unit (BBU) (including a CU and a DU) and an RU, or as a disaggregated base station including one or more of a CU, a DU, and/or an RU. The set of base stations, which may include disaggregated base stations and/or aggregated base stations, may be referred to as next generation (NG) RAN (NG-RAN).

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the base station 102 serving the UE 104. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL- TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may have an FEC outer coding component 198 that may be configured to generate, for a set of data packets associated with an application, a set of parity bits and generate an encoded data transmission associated with a UPF including the set of data packets and the generated set of parity bits. The FEC outer coding component 198 may further be configured to output, for a receiving device associated with the application, the encoded data transmission. In certain aspects, the base station 102 may have an FEC outer coding component 199 that may be configured to obtain an encoded data transmission associated with a UPF including a first plurality of bits associated with a set of data packets associated with an application and a second plurality of bits associated with a set of parity bits based on the set of data packets. The FEC outer coding component 199 may further be configured to decode the encoded data transmission to generate the set of data packets based on the first plurality of bits and the second plurality of bits and output, for one of an application client or an application server associated with the application, the set of data packets. While discussed in relation to an XR application, the concepts discussed in this disclosure may apply to other applications.

Figure 2:
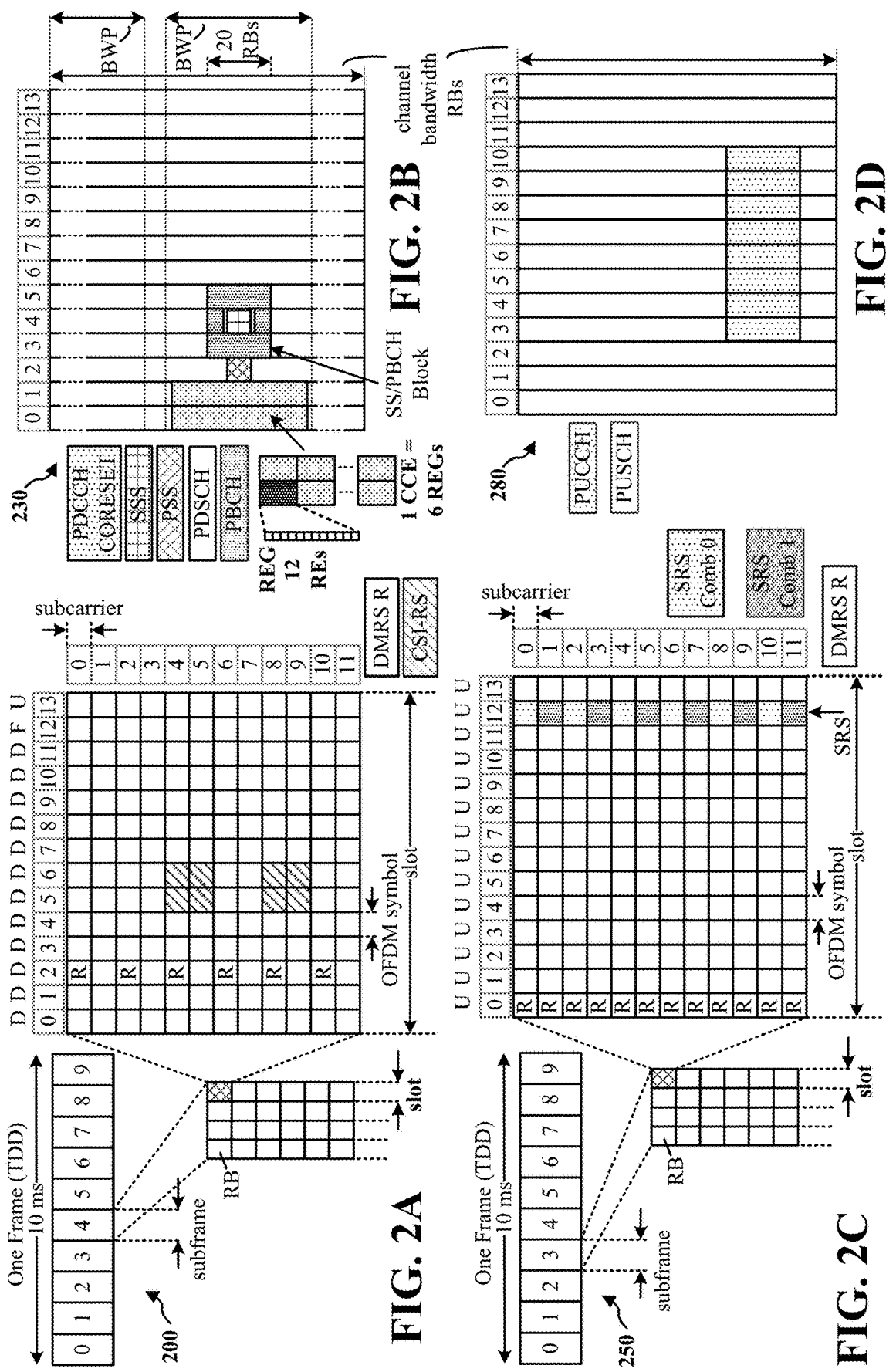
FIG. 2A is a diagram illustrating an example of a first frame, in accordance with various aspects of the present disclosure.
FIG. 2B is a diagram illustrating an example of downlink (DL) channels within a subframe, in accordance with various aspects of the present disclosure.
FIG. 2C is a diagram illustrating an example of a second frame, in accordance with various aspects of the present disclosure.
FIG. 2D is a diagram illustrating an example of uplink (UL) channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through RRC signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (for power limited scenarios; limited to a single stream transmission). The number of slots within a subframe is based on the CP and the numerology. The numerology defines the subcarrier spacing (SCS) (see Table 1). The symbol length/duration may scale with 1/SCS.

TABLE 1

Numerology, SCS, and CP

| μ | SCS $\Delta f = 2^\mu \cdot 15$[KHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |
| 5 | 480 | Normal |
| 6 | 960 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology u, there are 14 symbols/slot and $2^\mu$ slots/subframe. The subcarrier spacing may be equal to $2^\mu*15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB)

(also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
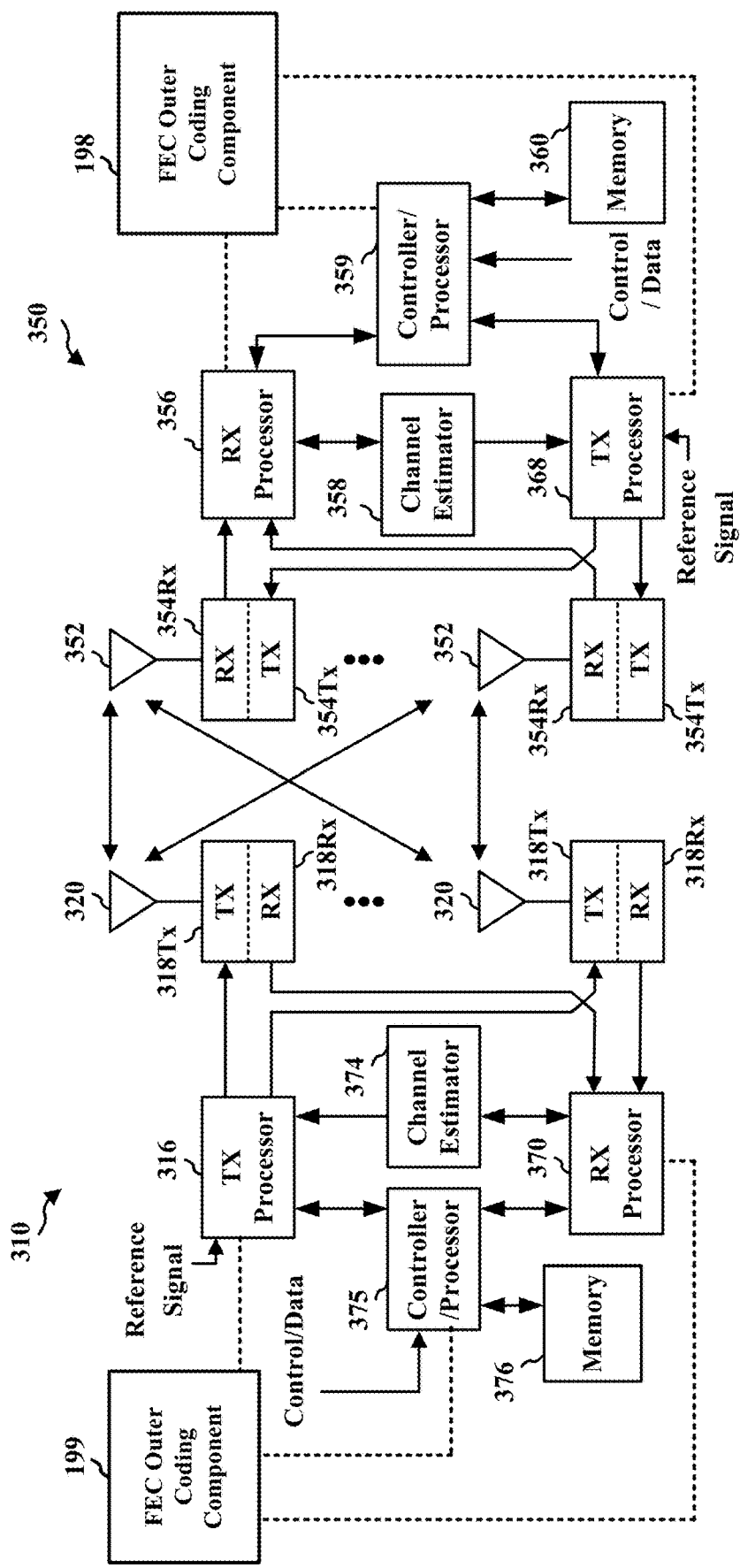
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes an RRC layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging. RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with at least one memory 360 that stores program codes and data. The at least one memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antennas 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a RX processor 370.

The controller/processor 375 can be associated with at least one memory 376 that stores program codes and data. The at least one memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the TX processor 368, the RX processor 356, and the controller/processor 359 may be configured to perform aspects in connection with the FEC outer coding component 198 of FIG. 1.

At least one of the TX processor 316, the RX processor 370, and the controller/processor 375 may be configured to perform aspects in connection with the FEC outer coding component 199 of FIG. 1.

In some aspects of wireless communication, particular applications may have tight latency and/or power consumption thresholds. For example, an XR application may be associated with a PDU set or burst to be delivered within a tight delay budget (e.g., 10 ms) and with a power consumption (e.g., <1 W) of AR glasses. For such applications, one or more retransmissions (e.g., associated with ARQ, or HARQ) may be used to correct a detected packet error, but the retransmission may increase the latency and/or the power consumption due to its long turn-around time. FEC outer coding, in some aspects, may be used to avoid a retransmission procedure by transmitting redundant parity symbols. By avoiding retransmissions, the use of FEC may thus improve the latency and/or the power consumption. In some aspects, this FEC outer coding utilizes RAN-related information to optimize the performance.

Figure 4:
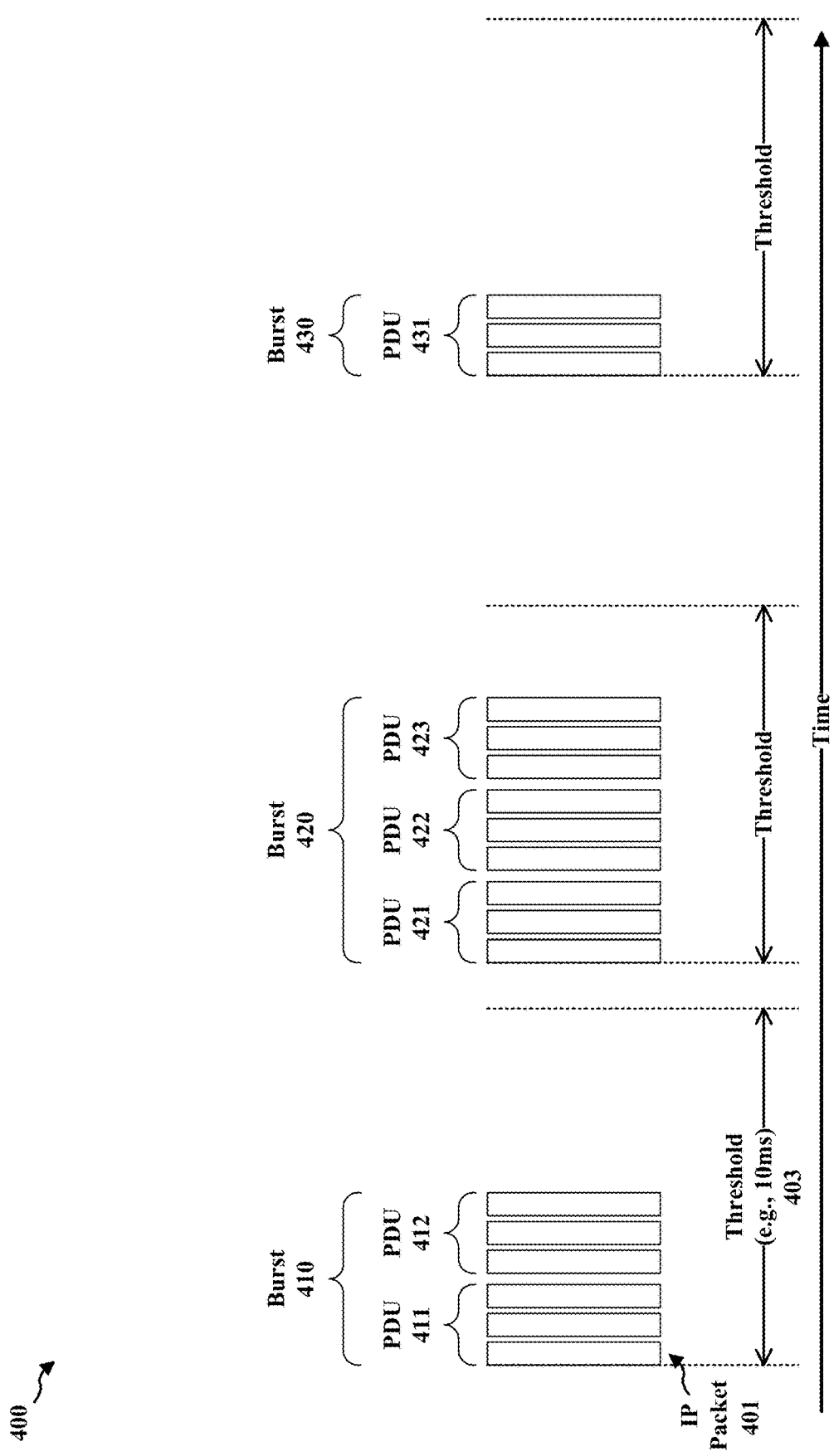
FIG. 4 is a diagram of a traffic flow associated with an extended reality (XR) application.

FIG. 4 is a diagram 400 of a traffic flow associated with an XR application. Diagram 400 illustrates individual IP packets (e.g., IP packet 401) grouped into PDUs (e.g., PDU 411, PDU 412, PDU 421, PDU 422, PDU 423, and PDU 431) for an XR application. The PDUs may further be grouped into data bursts (e.g., burst 410, burst 420, and burst 430) that may be associated with a same video frame or slice (or other data presented or used to provide an element of an XR application at a same time) such that a single threshold time or packet delay budget, e.g., threshold 403, may be applied to the burst as a whole. Accordingly, in some aspects, reducing a latency associated with ensuring correct reception may be more important for applications with larger bursts of data with a shorter time between the end of a last transmission in a burst and a threshold time at which the data included in the burst may no longer be useful than for applications associated with individual IP packets. For example, if a threshold time of 10 ms is applied to IP packets of a first application and the same threshold time is applied to bursts of a second XR application, the likelihood of running out of time for an individual IP packet using re-transmission to ensure accurate reception may be much lower than the likelihood of running out of time for a burst (e.g., burst 420) including nine IP packets where the threshold time for accurately receiving the nine packets of the burst may begin at the transmission of the first IP packet and the ninth IP packet may be transmitted near the end of the threshold time.

Figure 5:
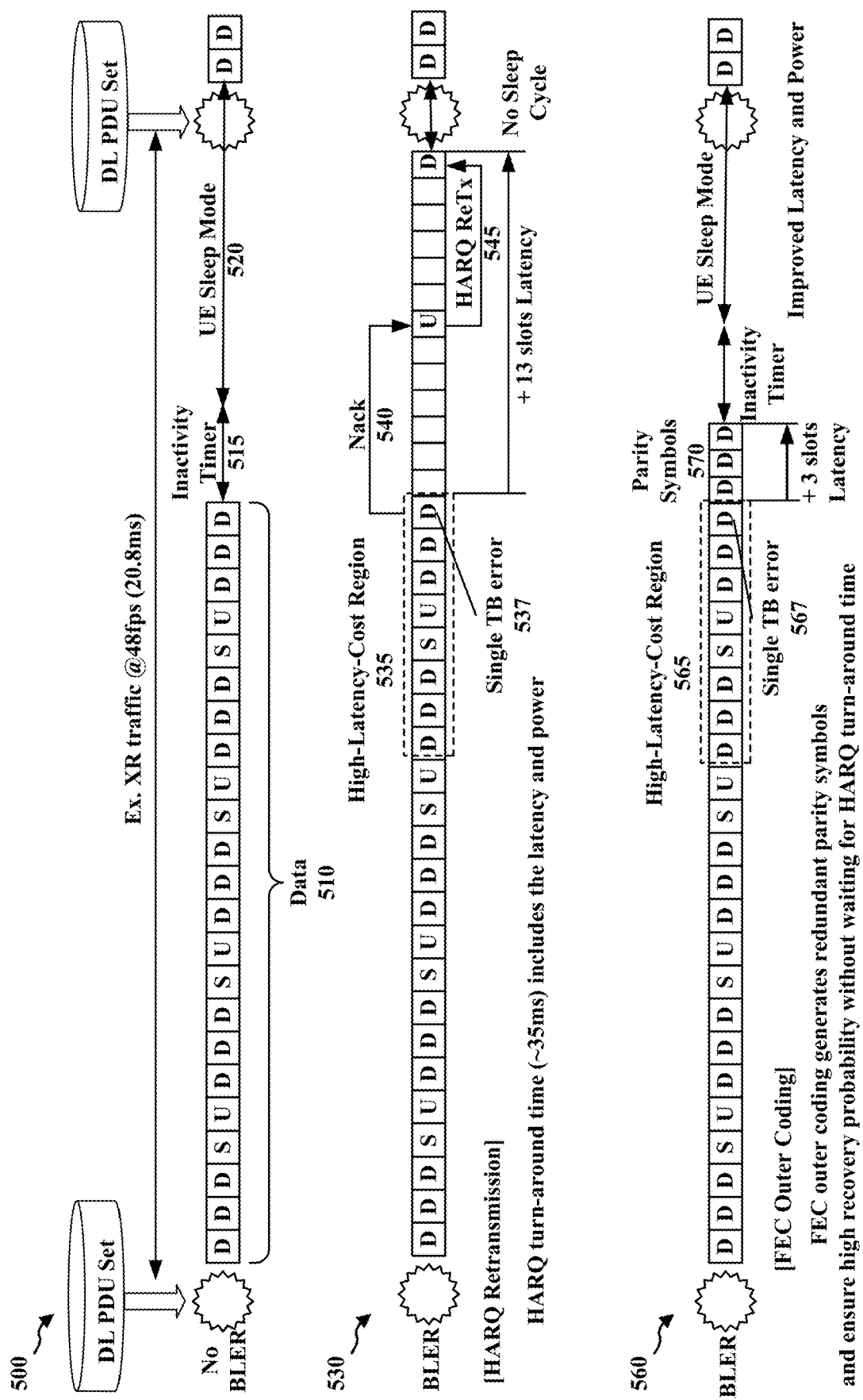
FIG. 5 is a set of diagrams illustrating a data transmission without an error and two methods of error correction and associated characteristics associated with latency and/or power in accordance with some aspects of the disclosure.

FIG. 5 is a set of diagrams (e.g., diagram 500, diagram 530, and diagram 560) illustrating a data transmission without an error (e.g., a block error rate (BLER)) and two methods of error correction and associated characteristics associated with latency and/or power in accordance with some aspects of the disclosure. Diagram 500 illustrates that data 510 may be transmitted (without error) followed by an inactivity time 515 (e.g., a threshold time between data transmission and a sleep mode 520). Diagram 530 illustrates that when using HARQ re-transmission, a single TB error 537 in a high-latency-cost region 535 of the data may be associated with a NACK 540 leading to a HARQ re-transmission 545 and a latency of 13 slots. The HARQ re-transmission illustrated in diagram 530 may have a high latency and may not allow for entering a low-power (e.g., sleep) mode of operation. Diagram 560 illustrates the improved latency and power consumption associated with FEC outer coding (FEC OC). In a high-latency-cost region 565 a single TB error 567 may be corrected based on a set of parity symbols 570 (e.g., adding a latency of 3 slots). Compared to the HARQ re-transmission, an FEC OC may introduce a shorter latency and may allow for entering a low-power (e.g., sleep) mode of operation.

Figure 6:
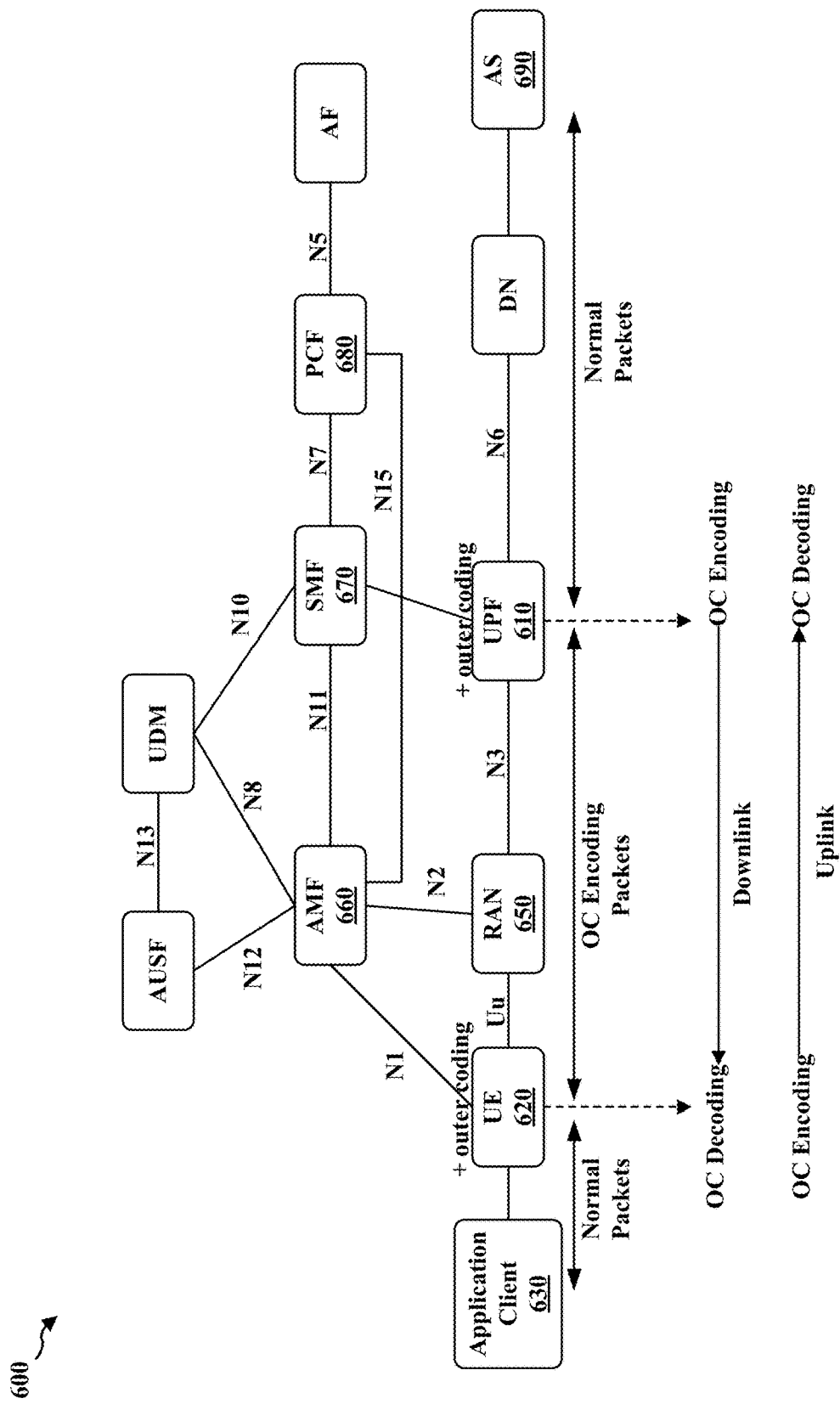
FIG. 6 is a diagram illustrating elements of a network implementing forward error correction (FEC) outer coding (OC) in accordance with some aspects of the disclosure.

FIG. 6 is a diagram 600 illustrating elements of a network implementing FEC OC in accordance with some aspects of the disclosure. In some aspects, a 5G network may be centralized and virtualized such that additional FEC OC functionality may easily be added. In some aspects of the disclosure, an FEC OC is introduced at, or associated with, a UPF 610 (e.g., at a layer of a protocol stack that may be associated with the UPF) such that the UPF 610 applies FEC OC to incoming data packets (and decodes data packets received with FEC OC). To upgrade the network for the application of FEC OC at, or associated with, the UPF 610, in some aspects, may involve minimal upgrade effort, the FEC OC may be transparent to the application layer, and the FEC OC may be moderately affected by radio conditions.

In some aspects, the FEC OC applied at the UPF 610 may be based on FEC OC encoding parameters (or FEC OC parameters). The FEC OC parameters, in some aspects, may include one or more of an OC type (e.g., RaptorQ code, RS code), a symbol size (e.g., a number of bits or bytes), a number of parity symbols (e.g., a ratio of parity symbols to a number of source blocks or an absolute number of parity symbols), a source block size (e.g., a number of symbols, bits, or bytes, per source block). In some aspects, the FEC OC parameters may be based on RAN-related information such as one or more of a number of blocks (e.g., per PDU or burst), an average TB size, a target error rate, and/or a correlated burst error (or burst error rate).

The FEC OC parameters, in some aspects, may be provided to the UPF (or a corresponding component of a UE applying FEC OC) from a RAN 650 to the UPF 610 (or the UE 620) or may be determined at the UPF 610 (or the UE 620), e.g., based on the RAN-related information indicated above. In some aspects, the RAN 650 may provide the FEC OC parameters via other elements of the network such as via access and mobility management function (AMF) 660 and session management function (SMF) 670 where the FEC OC parameters may be provided based on an OC policy provided by the policy control function (PCF) 680 to the SMF 670 (e.g., a policy identifying one or more 5-tuples indicating one or more flows for which to apply the FEC OC). The SMF 670, in some aspects, may, in turn, indicate to the AMF 660 and the UPF 610 which quality of service (QOS) flow(s) are to have FEC OC applied. The UPF 610 may, based on the indication from the SMF 670, request FEC OC parameters from the RAN 650. In some aspects, the RAN 650 of the AMF 660 may then indicate to the UE 620 that the FEC OC has been activated (or is active). The FEC OC param-eters determined by the UPF 610 or the UE 620 (e.g., an encoding and/or transmitting device), in some aspects, may be communicated to a decoding and/or receiving device via a header of the FEC OC.

Figure 7:
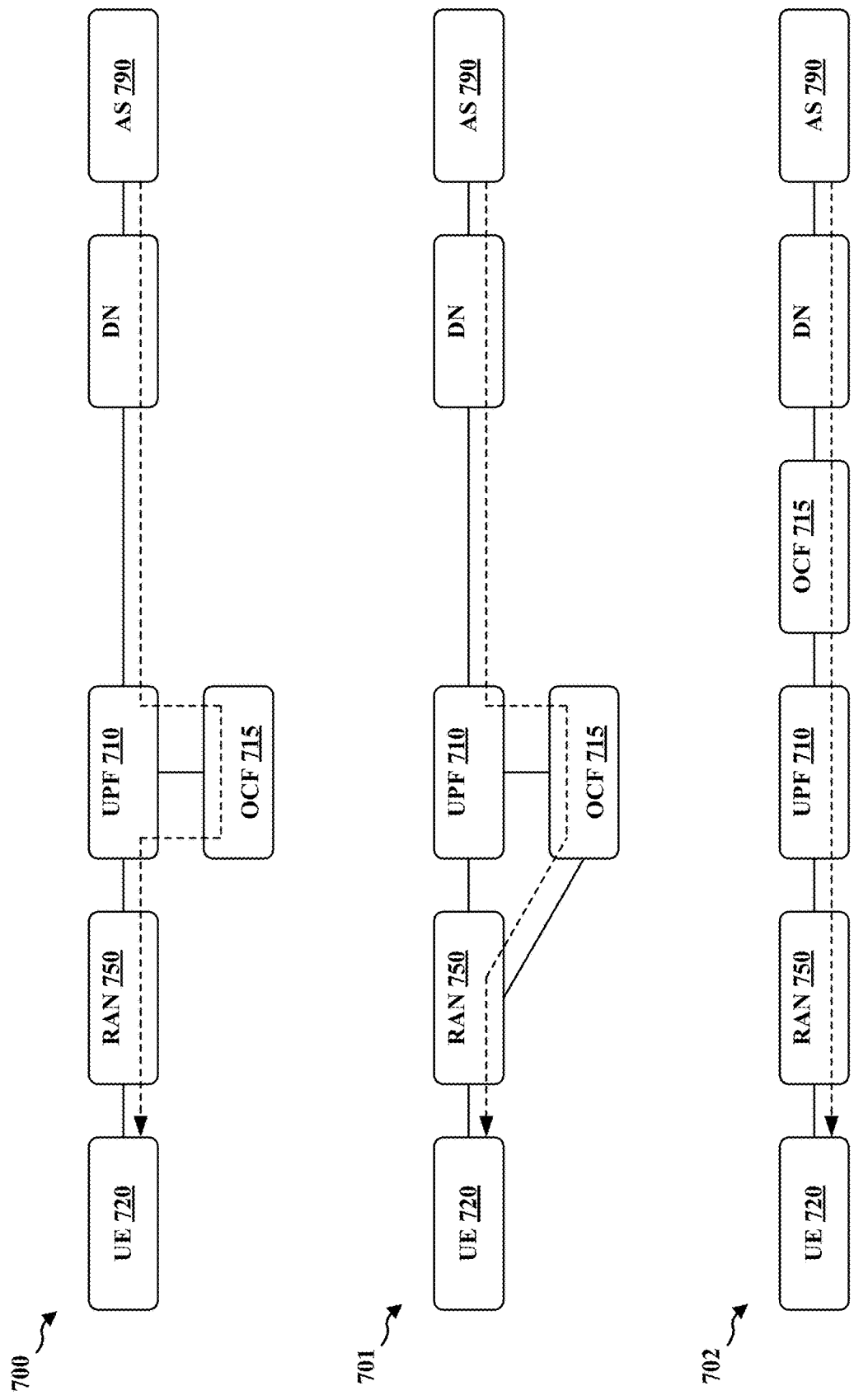
FIG. 7 is a set of diagrams illustrating an outer coding function (OCF) that may be added to the network to perform the FEC OC in accordance with some aspects of the disclosure.

FIG. 7 is a set of diagrams (e.g., diagram 700, diagram 701, and diagram 702) illustrating an outer coding function (OCF) 715 that may be added to the network to perform the FEC OC in accordance with some aspects of the disclosure. For example, diagram 700 illustrates that an OCF 715 may be added "off" the UPF 710, such that the UPF 710 provided a set of packets (e.g., a PDU or PDU set) to the OCF 715 and receives the encoded packets (e.g., the PDU with the FEC OC applied) from the OCF 715. Diagram 701 illustrates that, in some aspects, the OCF 715 may receive the packets for encoding from the UPF 710 and provide them directly to the RAN 750. Diagram 702 illustrates an additional alternative in which the OCF 715 is located inline between an AS 790 and the UPF 710. In each of the network architectures presented in FIGS. 6 and 7, an application server (e.g., AS 790) and an application client (e.g., application client 630) may be unaware of the FEC OC as the encoding and decoding are performed after being transmitted at one end (either the AS 790 or the application client 630) and before being received at the other end (e.g., the application client or the AS 790).

Figure 8:
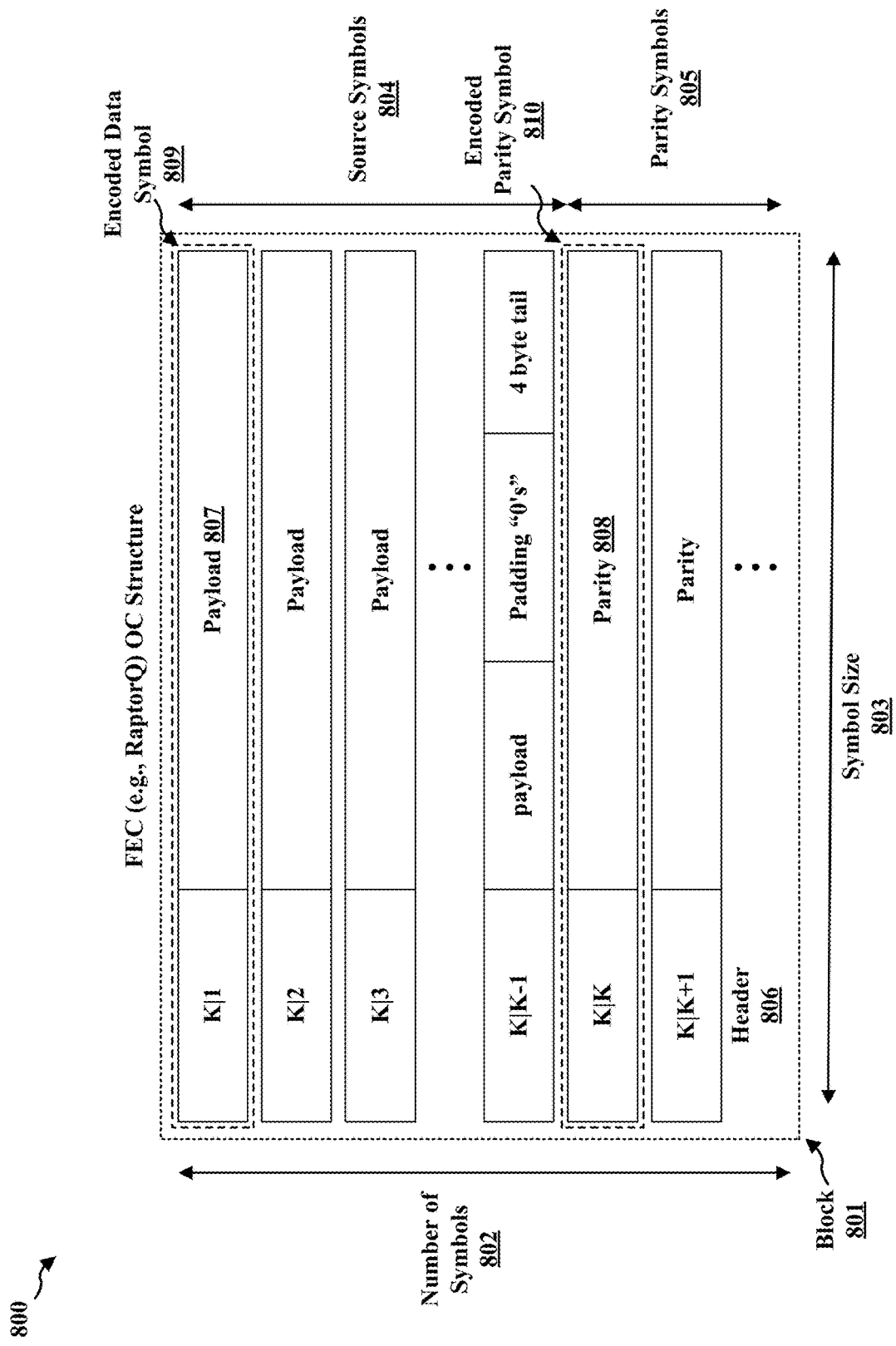
FIG. 8 is a diagram illustrating a set of packets associated with an FEC OC in accordance with some aspects of the disclosure.

FIG. 8 is a diagram 800 illustrating a set of packets associated with an FEC OC in accordance with some aspects of the disclosure. In some aspects, the FEC OC may work at the level of a block 801. The block 801 may include a set of encoded data symbols 809 (or packets) that may be based on a set of source symbols 804 (e.g., symbols associated with a set of IP packets that make up a PDU or burst of PDUs). The source symbols 804, and/or an encoded data symbol 809, may be associated with a payload 807 (e.g., a payload of the associated IP packets) and a header 806. In some aspects, the header 806 may include an indication of one or more of an FEC payload ID including one or more of a source block number (SBN) indicating an integer ID for the source block related to the encoding symbols within the packet, and an encoding symbol ID (ESI) indicating an integer ID for the encoding symbols within the packet; an FEC object transmission information (OTI) (common) including one or more of a transfer length (F), an encoding symbol length (T); or an FEC object transmission information (scheme-specific) including one or more of a number of source blocks (Z), a number of sub-blocks (N), and/or a symbol alignment parameter (A1). The block 801 may further include a set of one or more encoded parity symbols 805 (e.g., including an individual encoded parity symbol 810) including parity symbols (e.g., parity symbols 808) based on the symbols of the payloads of the source symbols 804 (e.g., payload 807). The header 806 (or at least one header), in some aspects, may include an indication of a number of symbols 802 associated with the block 801. The FEC OC may be associated with a symbol size 803 of the encoded data symbol 809 and/or the encoded parity symbol 810.

Figure 9:
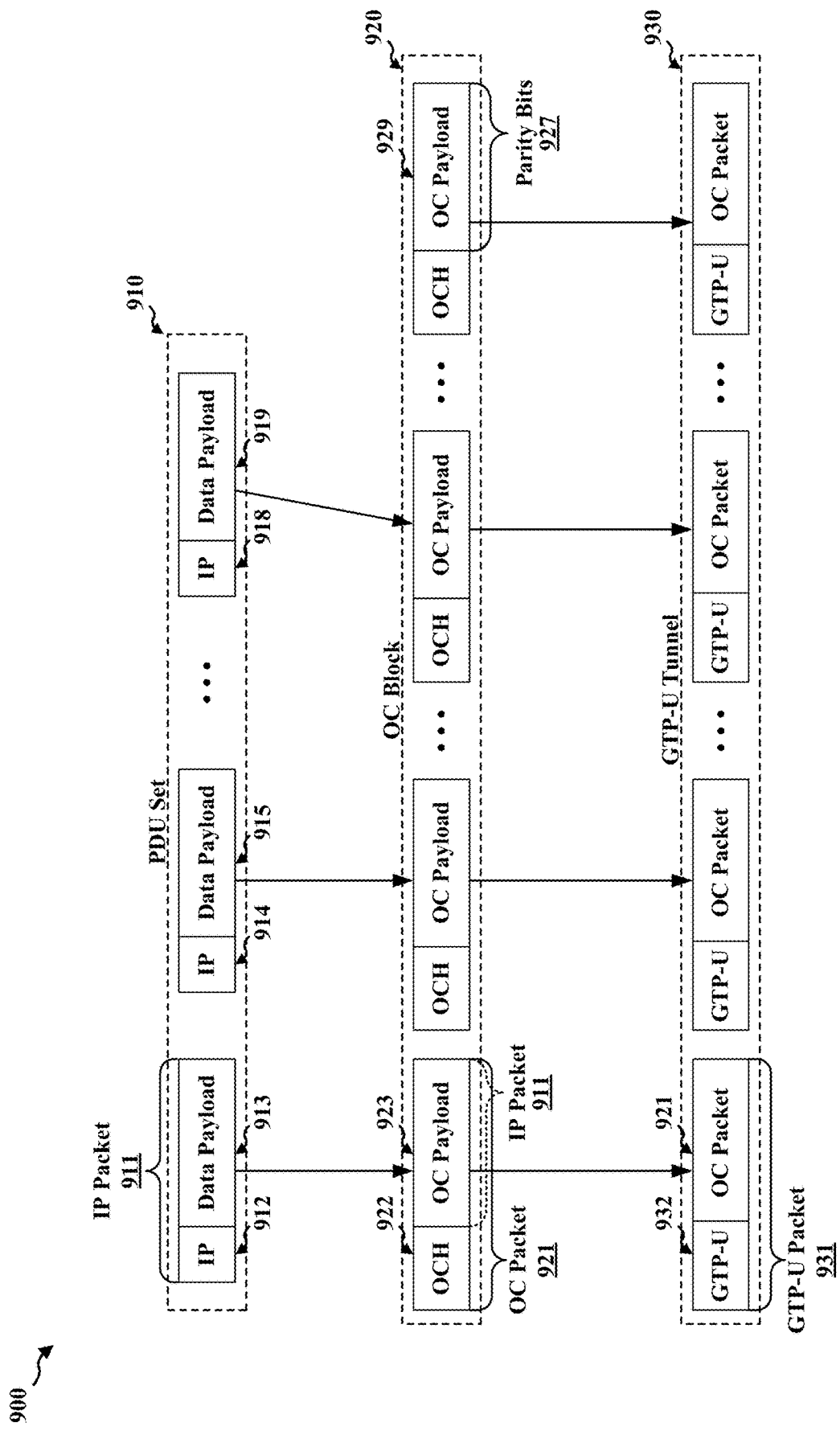
FIG. 9 is a diagram illustrating a set of operations associated with an FEC OC method in accordance with some aspects of the disclosure.

FIG. 9 is a diagram 900 illustrating a set of operations associated with an FEC OC method in accordance with some aspects of the disclosure. Diagram 900 illustrates an FEC OC method may aggregate a set of IP packets into a PDU set 910 including a plurality of IP packets (e.g., a first IP packet 911 including an IP header 912 and a data payload 913, a second IP packet including an IP header 914 and a data payload 915, and a final IP packet of the PDU set including an IP header 918 and a data payload 919). The FEC OC, in some aspects, may use the IP packet including an IP header and a data payload (e.g., each of the first, second, and final IP packets including, respectively, the IP header 912 and the data payload 913, the IP header 914 and the data payload 915, and the IP header 918 and the data payload 919) as the payload (e.g., the OC payload) for a corresponding OC packet. For example, OC packet 921 may include the IP packet 911 as the OC payload 923. In generating the OC packet 921, the FEC OC method may generate an OC header 922 that may correspond to header 806 of FIG. 8 and include the parameters used to decode the OC packet (e.g., de-capsulate the OC payload and identify the data payload (or data symbols) and parity symbols). In addition to the OC packets corresponding to IP packets, the FEC OC method may generate one or more OC packets with an OC payload 929 associated with parity symbols and/or parity bits 927 used for the FEC.

In some aspects, the OC packets may be further processed to generate general packet radio service (GPRS) tunneling protocol (GTP) user plane (GTP-U) tunnel packets 930 (e.g., GTP-U packet 931) associated with the OC block 920. The GTP-U tunnel packets, e.g., GTP-U packet 931, may include a GTP-U header 932 and a corresponding OC packet 921, where the GTP-U header 932 allows the GTP-U tunnel packet to tunnel through (or traverse) an intervening network while maintaining an association of the data payload with an IP address that may be for a virtualized (or private) network that may use IP addresses that are not globally unique. When maintaining the IP header within the payload of the OC packet, the FEC OC may, in some aspects, perform a robust header compression (ROHC) on the IP header as the PDCP layer may not be able to perform the ROHC on the IP header included ("buried") in the OC packet that the PDCP may not be configured to decapsulate and/or decode.

Figure 10:
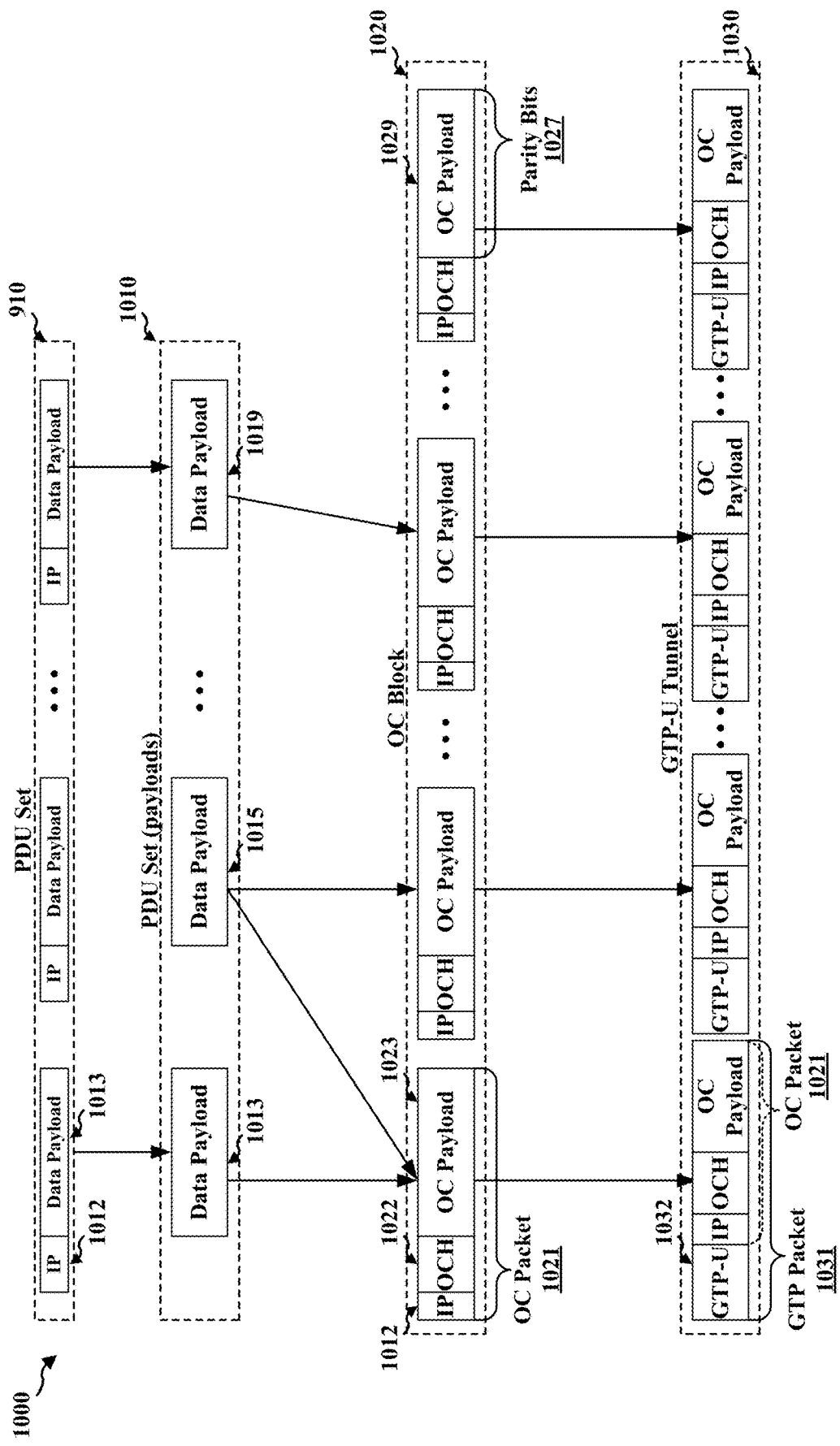
FIG. 10 is a diagram illustrating a set of operations associated with an FEC OC method in accordance with some aspects of the disclosure.

FIG. 10 is a diagram 1000 illustrating a set of operations associated with an FEC OC method in accordance with some aspects of the disclosure. Diagram 1000 illustrates an FEC OC method applied to the IP packets aggregated into a PDU set 910 including a plurality of IP packets (e.g., a first IP packet similar to IP packet 911 including an IP header 1012 and a data payload 1013, a second IP packet including a data payload 1015, and a final IP packet of the PDU set including a data payload 1019). The FEC OC, in some aspects, may strip the IP packet header to isolate the data payload into an aggregated set of data payloads associated with a PDU set 1010 (e.g., each of the data payloads 1013, 1015, and 1019) as the payload (e.g., the OC payload) for one or more OC packets. In some aspects, because the IP headers are stripped, the OC payload may be larger than the data payloads 1013, 1015, and/or 1019 and each OC payload may include symbols (e.g., data) associated with more than one data payload of an IP packet. For example, OC packet 1021 (and, specifically, OC payload 1023) may include data from data payload 1013 and data payload 1015. In generating the OC packet 1021, the FEC OC method may generate an OC header 1022 that may correspond to header 806 of FIG. 8 and include the parameters used to decode the OC packet (e.g., de-capsulate the OC payload and identify the data payload (or data symbols) and parity symbols). Generating the OC packet, in some aspects, may further include appending the IP header to the OC header (e.g., OC header 1022) and the OC payload (e.g., OC payload 1023) to create what may be treated as an IP packet by other layers of a protocol stack for transmitting and/or receiving the OC packets. In addition to the OC packets corresponding to the data payloads of the IP packets, the FEC OC method may generate one or more OC packets with an OC payload 1029 associated with parity symbols and/or parity bits 1027 used for the FEC.

In some aspects, the OC packets may be further processed to generate GTP-U tunnel packets 1030 (e.g., GTP-U packet 1031) associated with the OC block 1020. The GTP-U tunnel packets, e.g., GTP-U packet 1031, may include a GTP-U header 1032 and a corresponding OC packet 1021, where the GTP-U header 1032 allows the GTP-U tunnel packet to tunnel through (or traverse) an intervening network while maintaining an association of the data payload with an IP address that may be for a virtualized (or private) network that may use IP addresses that are not globally unique. When maintaining the IP header outside of the header and payload of the OC packet, the FEC OC may, in some aspects, perform a robust header compression (ROHC) on the IP header or may leave the ROHC to be performed by the PDCP layer that may be able to perform the ROHC on the IP header that it may be able to access based on the IP header being included outside of the OC header and OC payload.

Figure 11:
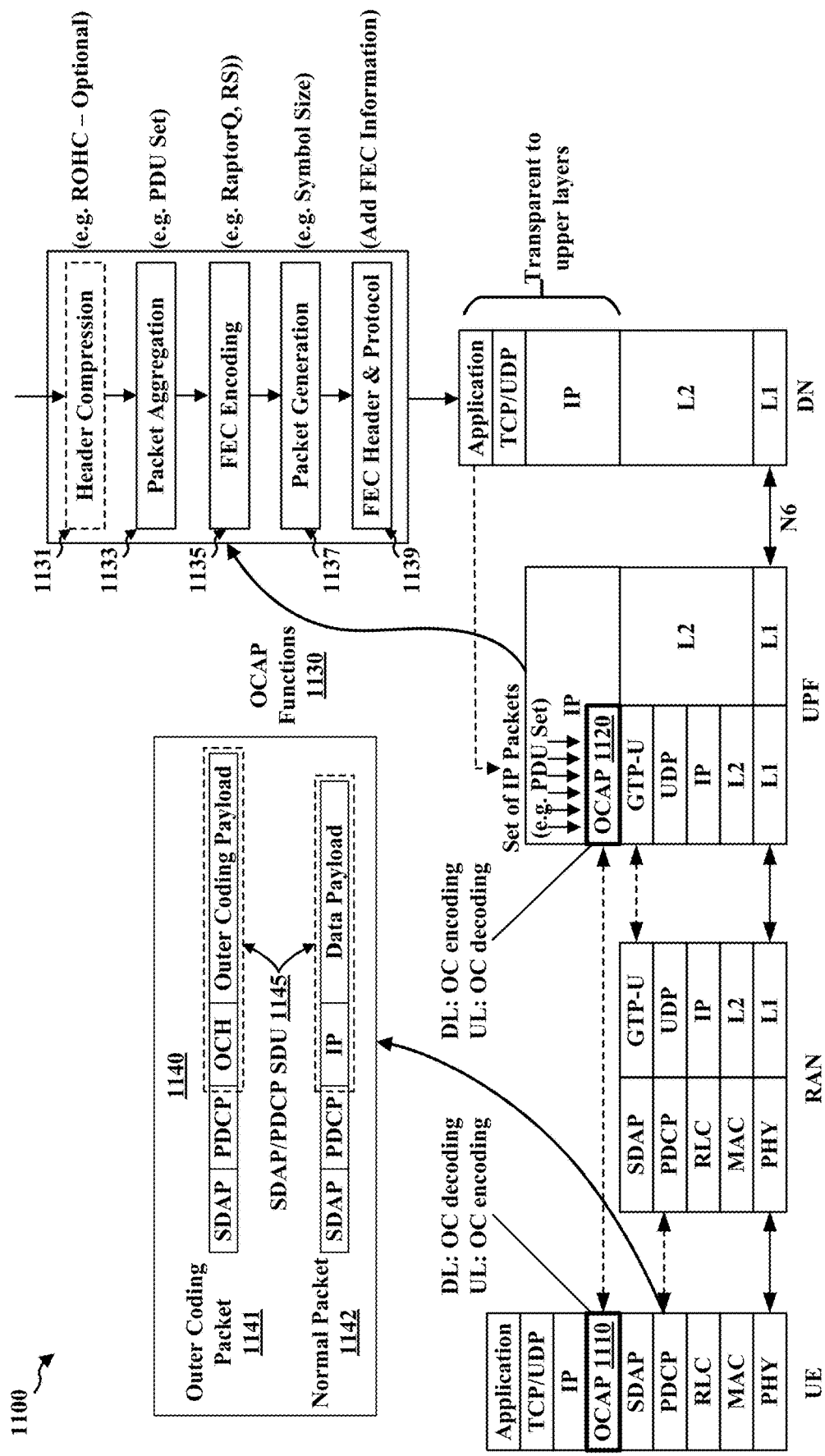
FIG. 11 is a diagram illustrating a protocol stack incorporating an outer coding adaptation protocol (OCAP) associated with the outer coding (e.g., the FEC OC) in accordance with some aspects of the disclosure.

One of the encapsulation methods described above in relation to FIGS. 9 and 10 may be selected based on a structure of a protocol stack (as discussed below in relation to FIG. 11) and/or an amount of processing power associated with a component performing the FEC OC method (e.g., a UPF or dedicated OCF component and/or element). FIG. 11 is a diagram 1100 illustrating a protocol stack incorporating an outer coding adaptation protocol (OCAP) associated with the outer coding (e.g., the FEC OC) in accordance with some aspects of the disclosure. In one example, a novel OCAP layer 1110 (or OCAP layer 1120) may be introduced that may perform an FEC OC process between a UPF and a UE (or vice versa). In some aspects, the OCAP layer may be associated with one or more of an OCAP header (e.g., the OC header 922 and 1022 of FIGS. 9 and 10) and a protocol (an OCAP protocol). As discussed above, the OCAP header may carry FEC information such as a symbol size, an encoding symbol length, an encoding symbol ID. In some aspects, different network entities may identify the boundaries of an OC block based on different headers associated with a network packet. For example, for a packet transmitted by an application server to a UPF. e.g., a real-time transport protocol (RTP) packet or secure RTP packet, a header may indicate the boundaries of an OC block (e.g., a PDU set). A packet transmitted by the UPF to a RAN, the GTP-U header may indicate the boundary of the OC block. e.g., for RAN scheduling purpose. In some aspects, for a packet transmitted from the RAN to a UE, the UE may be able to determine the OC block boundaries based on an outer coding (OC) header (OCH) or an SDAP. PDCP, or a new layer (such as the OCAP layer 1110) may identify (or an associated header may indicate) the boundary of the OC block.

In some aspects, the OCAP layer 1120 (and/or OCAP layer 1110) may be associated with a set of OCAP functions 1130 (e.g., encoding functions). In some aspects, the set of OCAP functions 1130 may include a header compression 1131 (e.g., associated with a robust header compression), a packet aggregation 1133 (e.g., identifying a set of packets and/or payloads associated with a PDU set as described in relation to one of PDU set 910 and/or PDU set 1010), an FEC encoding 1135 (e.g., associated with the OC block 920 and/or 1020), a packet generation 1137, and/or adding an FEC header and protocol 1139. In some aspects, the OCAP layer 1110 and/or OCAP layer 1120 may apply the set of OCAP functions 1130 in reverse to decode a packet with FEC OC applied. In some aspects, the PDCP layer and/or the SDAP layer may be associated with a set of packet formats 1140. In some aspects, a PDCP header and/or an SDAP header may be appended to an OC packet and the PDCP header and/or the SDAP header may indicate whether the service data unit (SDU) 1145 associated with the header is encoded by an OC method. If the packet is in a first OC packet format 1141, the PDCP and/or SDAP header indicates that the associated SDU 1145 is OC encoded, the SDU 1145, in some aspects, may be provided to an OCAP layer for processing. If the packet is in a second "normal," or non-OC, packet format 1142, the PDCP and/or SDAP header does not indicate that the associated SDU 1145 is OC encoded (or indicates that the associated SDU 1145 is not OC encoded), the SDU 1145, in some aspects, may be provided to an SDAP layer and/or PDCP layer (or by the DAP layer and/or the PDCP layer to an IP layer and may not be provided by an OCAP layer for processing (e.g., an OCAP layer may be skipped when processing the packet).

Figure 12:
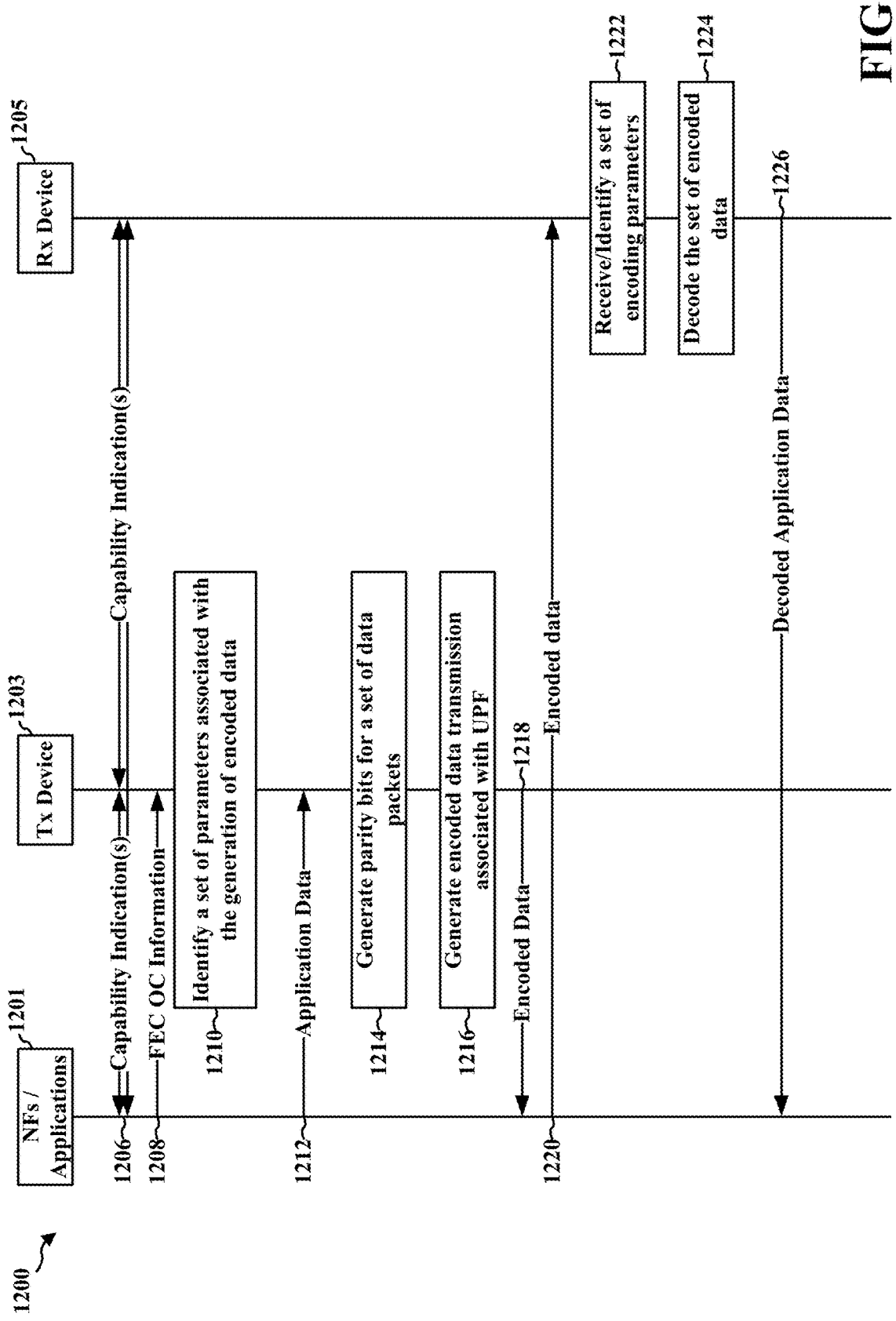
FIG. 12 is a call-flow diagram illustrating a method of wireless communication associated with a network including a set of network functions (NFs) and applications, a transmitting device, and a receiving device in accordance with some aspects of the disclosure.

FIG. 12 is a call-flow diagram 1200 illustrating a method of wireless communication associated with a network including a set of network functions (NFs) and applications 1201, a transmitting device 1203, and a receiving device 1205 in accordance with some aspects of the disclosure. In some aspects, the transmitting device 1203 may be one of a UPF (or associated OCF) or a UE and the receiving device 1205 may be a corresponding UE or UPF respectively, while the NFs and applications 1201 may include other network functions and/or an application server associated with the network or an application associated with the UE. For example, referring to FIG. 6, in some aspects, the NFs and applications 1201 may include the application client 630, the RAN 650, the AMF 660, the SMF 670, The PCF 680, and/or the AS 690. The functions ascribed to the transmitting device 1203 and/or the receiving device 1205, in some aspects, may be performed by one or more components of a network entity, a network node, a network device (a single network entity/node/device or a disaggregated network entity/node/device as described above in relation to FIG. 1), or a wireless device supporting communication with a network entity/node/device. Accordingly, references to "transmitting" in the description below may be understood to refer to a first component of one of the transmitting device 1203 and/or the receiving device 1205 outputting (or providing) an indication of the content of the transmission to be transmitted by a different component of the transmitting device 1203 and/or the receiving device 1205. Similarly, references to "receiving" in the description below may be understood to refer to a first component of the transmitting device 1203 and/or the receiving device 1205 receiving a transmitted signal and outputting (or providing) the received signal (or information based on the received signal) to a different component of the transmitting device 1203 and/or the receiving device 1205.

The transmitting device 1203 and the receiving device 1205, in some aspects, may exchange one or more capability indications 1206 with each other or with elements of the network (e.g., to a 5G core network generally or to an SMF of the NFs and applications 1201) indicating a capability of performing FEC OC or decoding an FEC OC packet (e.g., a packet encoded using FEC OC). Based on the one or more capability indications 1206, the transmitting device 1203 may receive FEC OC information 1208. In some aspects, the FEC OC information 1208 may include explicit OC encoding parameters such as one or more of an OC type (e.g., RaptorQ code, RS code), a symbol size (e.g., a number of bits or bytes), a number of parity symbols (e.g., a ratio of parity symbols to a number of source blocks or an absolute number of parity symbols), a source block size (e.g., a number of symbols, bits, or bytes, per source block). The FEC OC information 1208, in some aspects, may include RAN-related information such as one or more of a number of blocks (e.g., per PDU or burst), an average TB size, a target error rate, and/or a correlated burst error (or burst error rate).

The FEC OC information 1208, in some aspects, may be provided to the transmitting device (e.g., a UPF or a corresponding component of a UE applying FEC OC) from a RAN (e.g., RAN 650) and/or an AMF (e.g., based on information such as a flow identifier received from a PCF and SMF) as described in relation to FIG. 6 above. In some aspects, the FEC OC information 1208 may include an indication that the FEC OC is active (e.g., via RRC or non-access stratum (NAS)). If the FEC OC information 1208 includes the RAN-related information, the transmitting device 1203 may, at 1210, identify and/or determine OC encoding parameters associated with generating encoded data based on the FEC OC information 1208.

The NFs and/or applications 1201 may then transmit, and transmitting device 1203 may receive, application data 1212. The application data 1212 may include a header identifying a flow (e.g., via a 5-tuple in an IP header) to which an FEC OC may be applied (e.g., based on a policy received from a PCF/SMF). The application data 1212 may, in some aspects, include a plurality of IP packets making up a PDU (or PDU set) that may further make up an associated burst of packets and/or PDUs. Based on the OC encoding parameters identified and/or determined at 1210 and the application data 1212, in some aspects, the transmitting device 1203 may, at 1214, generate parity bits for the FEC associated with the application data 1212. The transmitting device 1203 may, at 1216, generate encoded packets associated with an encoded data transmission.

If the application data 1212, for example, includes a first plurality of IP packets including an IP header and a data payload, generating the set of parity bits at 1214 may be based on the first plurality of IP packets, and a set of outer coding packets (e.g., a first set of the outer coding packets generated at 1216) may include an outer coding header and a payload including a corresponding IP packet of the first plurality of IP packets (e.g., the payload of the OC packet may be the complete IP packet including the IP header and the data payload). In some aspects, generating the set of parity bits at 1214 may be based on the data payload of each of the first plurality of IP packets excluding the IP header, and a set of outer coding packets (e.g., a first set of the outer coding packets generated at 1216) may include an outer coding header and a payload including a data from the data payload of one or more of the IP packets of the first plurality of IP packets (e.g., the payload of the OC packet may be based on the data payload of the IP packet but not the IP header). The encoded packets may be associated with a new protocol layer of a protocol stack for processing data messages communicated as illustrated in FIG. 11. For example, the new protocol layer may be an OCAP layer.

In some aspects, the application data 1212 may include a first plurality of IP packets and the encoded data transmission generated at 1216 includes a second plurality of outer coding packets including a first set of outer coding packets including data associated with a corresponding IP packet in the first plurality of IP packets and a second set of outer coding packets comprising the set of parity bits. Generating the encoded data transmission at 1216, in some aspects, may include generating an outer coding header for each of the second plurality of packets. The outer coding header, in some aspects, may be associated with a processing at the OCAP layer of the protocol stack. In some aspects, generating the encoded data transmission at 1216 may include generating a GTP-U header applied after the outer coding header for each of the second plurality of packets. The GTP-U header, in some aspects, may be associated with a processing at a PDCP and/or SDAP layer of the protocol stack. In some aspects, generating the encoded data transmission at 1216 may include performing a robust header compression on an IP header of the first plurality of IP packets before an application of the outer coding header.

In some aspects, the outer coding header comprises decoding parameters associated with the FEC operation at the receiving device based on a set of encoding parameters used in generating the encoded data transmission. The outer coding header of the encoded data transmission generated at 1216 may include a set of decoding parameters including one or more of an SBN, an ESI, a transfer length, an encoding symbol length, a number of source blocks, a number of sub-blocks, or a symbol alignment parameter.

The transmitting device 1203 may then transmit (or provide), and the NFs and application 1201 (e.g., a RAN 650 of FIG. 6) may receive, the encoded data 1218. The NFs and applications 1201 may then transmit (or provide) and the receiving device 1205 may receive, the encoded data 1220. The receiving device 1205 may process the encoded data (e.g., at one or more layers associated with one or more headers "outside" the OC header) until reaching the OC header and determining and/or identifying, from the information in the OC header, the OC parameters at 1222. The OC parameters determined and/or identified at 1222, in some aspects, may include one or more of an encoding type, an SBN, an ESI, a transfer length, an encoding symbol length, a number of source blocks, a number of sub-blocks, or a symbol alignment parameter. Based on the OC parameters determined and/or identified at 1222, e.g., parameters associated with the size of the OC block and the FEC applied to the OC block, the receiving device 1205 may, at 1224, decode the encoded set of data to produce application data, e.g., IP packets. The receiving device 1205 may then provide the decoded IP packets (decoded application data 1226) to an application or application server in the NFs and applications 1201. Accordingly, from the perspective of the RAN and the application and/or the application server of the NFs and applications 1201, the FEC OC may be transparent.

Figure 13:
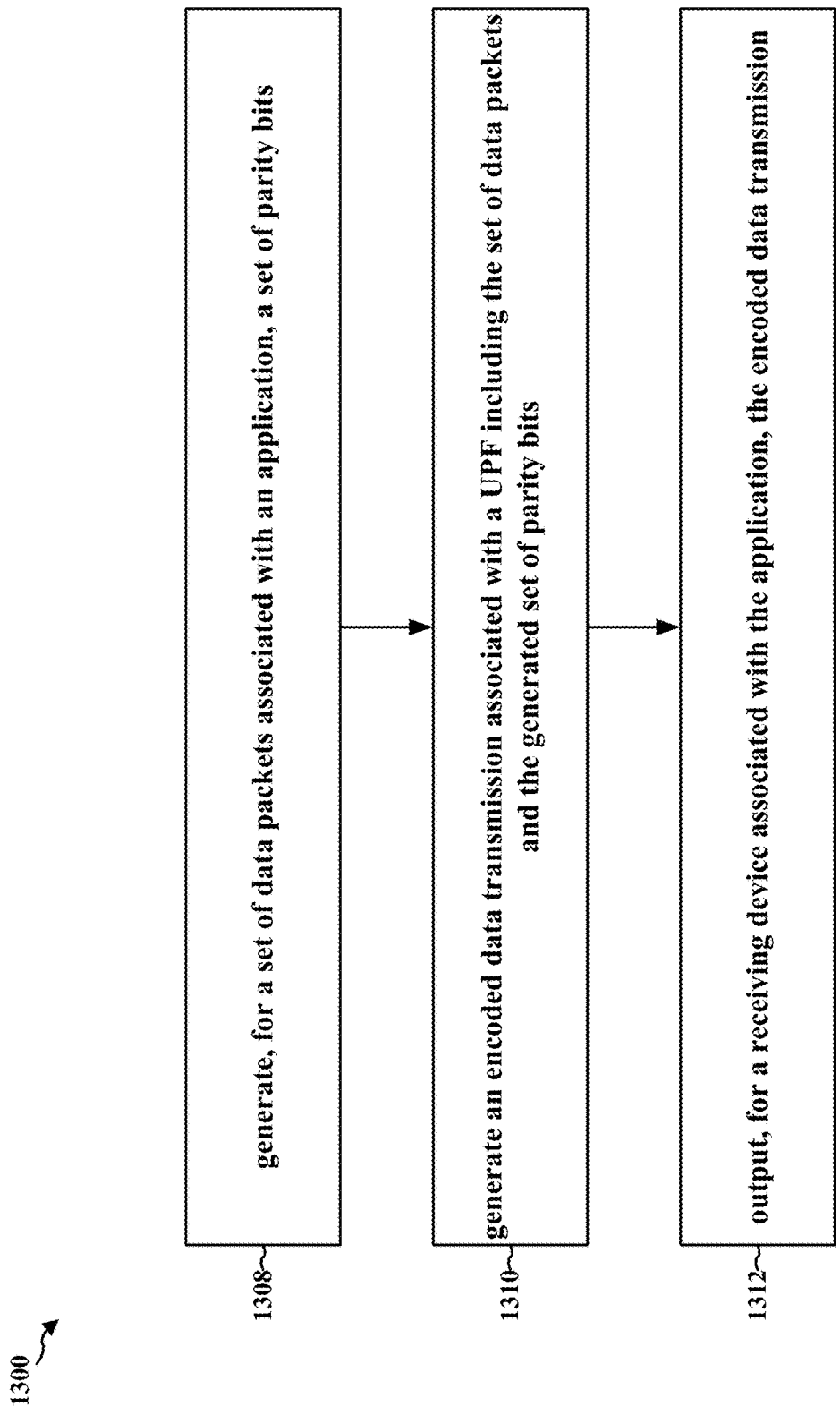
FIG. 13 is a flowchart of a method of wireless communication.

FIG. 13 is a flowchart 1300 of a method of wireless communication. The method may be performed by a UPF (or associated OCF) and/or a UE (e.g., the UE 104, 620, 720; the UPF 610, 710; the transmitting device 1203; the apparatus 1704; the network entity 1860). In some aspects, the transmitting device is at least one of a UE, a UPF, or an OCF block associated with a core network. The transmitting device may output an indication of a capability to generate an encoded data transmission. In some aspects, the transmitting device may be a UPF and the capability indication may be transmitted to a SMF. The transmitting device, in some aspects, may be a wireless device, e.g., a UE, and the capability indication may be output to a core network. For example, referring to FIG. 12, the transmitting device 1203, in some aspects, may transmit one or more capability indications 1206 to the NFs and applications 1201 (e.g., an SMF of the NFs and applications 1201) indicating a capability of performing FEC OC.

In some aspects, the transmitting device may determine a set of parameters associated with generating the encoded data transmission. Determining the set of parameters for generating the encoded data transmission, in some aspects, may include receiving a set of parameters associated with the generation of the encoded data transmission from a RAN network device (e.g., a set of FEC OC parameters or a set of RAN-related information used to determine the set of FEC OC parameters). The set of parameters, in some aspects, may be received directly from the RAN network device or from an SMF and/or an AMF. In some aspects, determining the set of parameters associated with generating the encoded data transmission, may include identifying a set of parameters associated with a generation of an encoded data transmission (e.g., a UL data transmission) and transmitting to a RAN network device, an indication of the set of parameters. In some aspects, the set of parameters may include outer coding encoding parameters for the encoded data transmission, such as at least one of an indication of an outer code type, a symbol size, a number of parity symbols, or a number of symbols for which to generate the encoded data transmission. In some aspects, receiving the set of parameters may include receiving information related to the RAN network device for determining the outer coding encoding parameters for the encoded data transmission. In some aspects, the information related to the RAN network device may include at least one of a number of blocks, an average size of a transport block, a target error rate, or a burst error rate. For example, referring to FIG. 12, the transmitting device 1203, in some aspects, may receive FEC OC information 1208 and may, at 1210, identify and/or determine OC encoding parameters associated with generating encoded data based on the FEC OC information 1208.

At 1308, the transmitting device may generate, for a set of data packets associated with an application, a set of parity bits. For example, 1308 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of data packets may be associated with a same PDU set or burst of multiple PDU sets associated with a particular application (e.g., an XR application). The generated parity bits may be based on a set of FEC parameters indicating a number of parity bits to generate explicitly or based on a number of data bits on which the FEC is being performed. For example, referring to FIG. 12, the transmitting device 1203, in some aspects, may, at 1214, generate parity bits for the FEC associated with the application data 1212.

At 1310, the transmitting device may generate an encoded data transmission associated with a UPF (e.g., at the UPF or for decoding at a UPF) including (or based on) the set of data packets (or the data in the data packets) and the generated set of parity bits. For example, 1310 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, generating the encoded data transmission at 1310 may be based on a capacity of the receiving device to decode the encoded data transmission. In some aspects, the encoded data transmission may be associated with a new protocol layer of a protocol stack for processing data messages communicated via a RAN. In some aspects, the new protocol layer may be an OCAP layer. In some aspects, the set of data packets may include one of a single IP packet, a plurality of IP packets, a PDU set, or a burst of data including a plurality of PDU sets. For example, referring to FIG. 12, the transmitting device 1203, in some aspects, may, at 1216, generate encoded packets associated with an encoded data transmission based on the application data 1212 and the parity bits generated at 1214.

The set of data packets, in some aspects, may include a first plurality of IP packets and the encoded data transmission may include a second plurality of outer coding packets including a first set of outer coding packets including data associated with a corresponding IP packet in the first plurality of IP packets and a second set of outer coding packets comprising the set of parity bits. In some aspects, generating the encoded data transmission at 1310 includes generating an outer coding header for each of the second plurality of packets, where the outer coding header is associated with a processing at the OCAP layer of the protocol stack. Generating the encoded data transmission at 1310, in some aspects, may include generating a GTP-U header applied after the outer coding header for each of the second plurality of packets, where the GTP-U header is associated with a processing at a one of a PDCP or a SDAP layer of the protocol stack.

In some aspects, the outer coding header includes decoding parameters associated with a FEC operation (to be performed) at the receiving device based on a set of encoding parameters used in generating the encoded data transmission. The decoding parameters, in some aspects, may include one or more of a SBN, an ESI, a transfer length, an encoding symbol length, a number of source blocks, a number of sub-blocks, or a symbol alignment parameter. In some aspects, a PDCP header associated with a PDCP payload including the encoded data transmission indicates whether the outer coding header is included in the PDCP payload (e.g., an SDU).

At 1312, the transmitting device may output, for a receiving device associated with the application, the encoded data transmission. For example, 1312 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. Referring to FIG. 12, for example, the transmitting device 1203 may transmit (or provide) the encoded data 1218 to the NFs and application 1201 (e.g., a RAN 650 of FIG. 6) for transmission to the receiving device 1205 as encoded data 1220.

Figure 14:
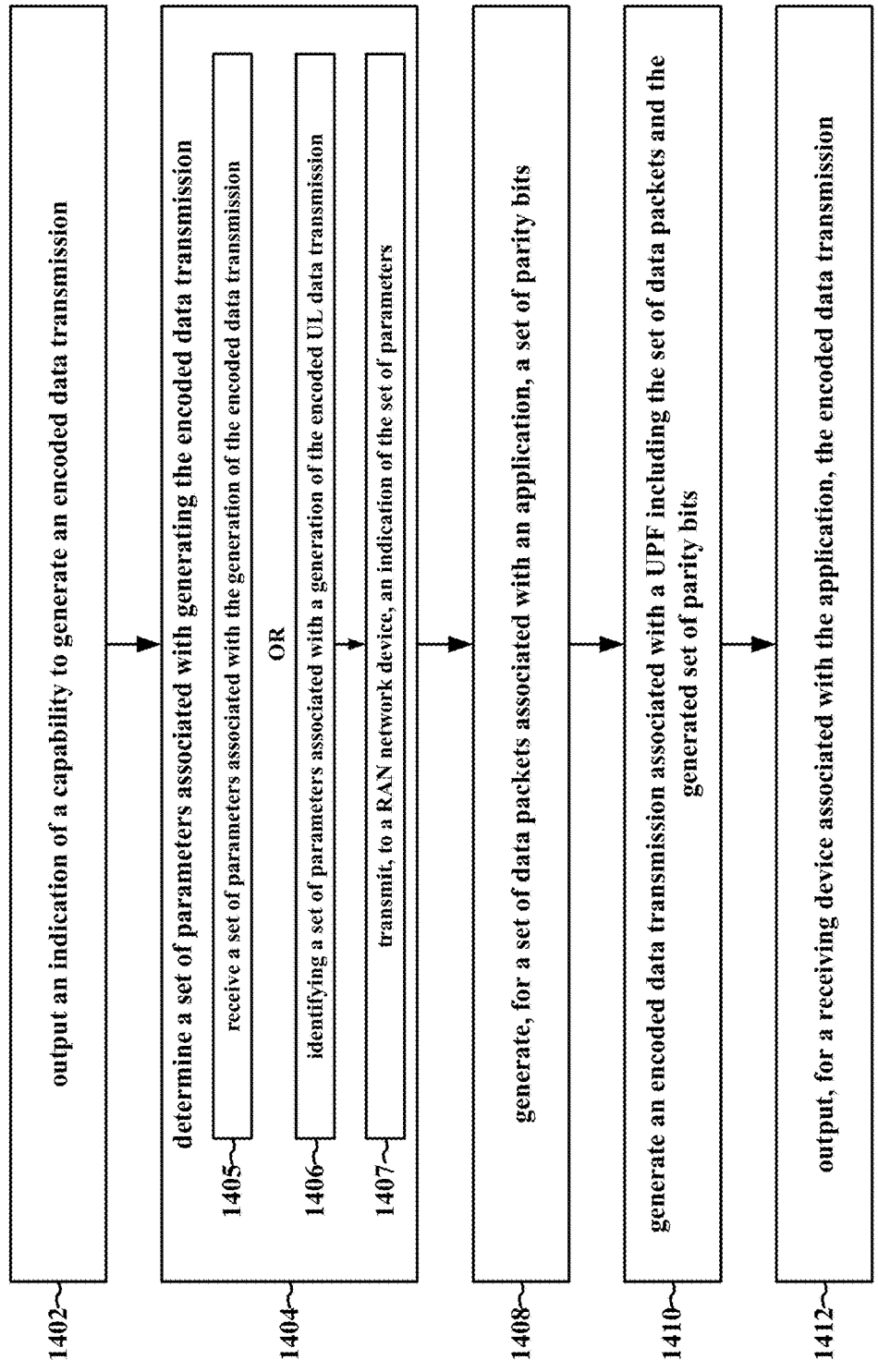
FIG. 14 is a flowchart of a method of wireless communication.

FIG. 14 is a flowchart 1400 of a method of wireless communication. The method may be performed by a UPF (or associated OCF) and/or a UE (e.g., the UE 104, 620, 720; the UPF 610, 710; the transmitting device 1203; the apparatus 1704; the network entity 1860). In some aspects, the transmitting device is at least one of a UE, a UPF, or an OCF block associated with a core network. At 1402, the transmitting device may output an indication of a capability to generate an encoded data transmission. For example, 1402 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the transmitting device may be a UPF and the capability indication may be transmitted to a SMF. The transmitting device, in some aspects, may be a wireless device, e.g., a UE, and the capability indication may be output to a core network. For example, referring to FIG. 12, the transmitting device 1203, in some aspects, may transmit one or more capability indications 1206 to the NFs and applications 1201 (e.g., an SMF of the NFs and applications 1201) indicating a capability of performing FEC OC.

At 1404, the transmitting device may determine a set of parameters associated with generating the encoded data transmission. Determining the set of parameters for generating the encoded data transmission at 1404, in some aspects, may include receiving, at 1405, a set of parameters associated with the generation of the encoded data transmission from a RAN network device (e.g., a set of FEC OC parameters or a set of RAN-related information used to determine the set of FEC OC parameters). The set of parameters, in some aspects, may be received directly from the RAN network device or from an SMF and/or an AMF. In some aspects, determining the set of parameters associated with generating the encoded data transmission at 1404, may include identifying, at 1406, a set of parameters associated with a generation of an encoded data transmission (e.g., a UL data transmission) and transmitting, at 1407, to a RAN network device, an indication of the set of parameters. For example, 1404, 1405, 1406, and/or 1407 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of parameters may include outer coding encoding parameters for the encoded data transmission, such as at least one of an indication of an outer code type, a symbol size, a number of parity symbols, or a number of symbols for which to generate the encoded data transmission. In some aspects, receiving the set of parameters at 1405 may include receiving information related to the RAN network device for determining the outer coding encoding parameters for the encoded data transmission. In some aspects, the information related to the RAN network device may include at least one of a number of blocks, an average size of a transport block, a target error rate, or a burst error rate. For example, referring to FIG. 12, the transmitting device 1203, in some aspects, may receive FEC OC information 1208 and may, at 1210, identify and/or determine OC encoding parameters associated with generating encoded data based on the FEC OC information 1208.

At 1408, the transmitting device may generate, for a set of data packets associated with an application, a set of parity bits. For example, 1408 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of data packets may be associated with a same PDU set or burst of multiple PDU sets associated with a particular application (e.g., an XR application). The generated parity bits may be based on a set of FEC parameters indicating a number of parity bits to generate explicitly or based on a number of data bits on which the FEC is being performed. For example, referring to FIG. 12, the transmitting device 1203, in some aspects, may, at 1214, generate parity bits for the FEC associated with the application data 1212.

At 1410, the transmitting device may generate an encoded data transmission associated with a UPF (e.g., at the UPF or for decoding at a UPF) including (or based on) the set of data packets (or the data in the data packets) and the generated set of parity bits. For example, 1410 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, generating the encoded data transmission at 1410 may be based on a capacity of the receiving device to decode the encoded data transmission. In some aspects, the encoded data transmission may be associated with a new protocol layer of a protocol stack for processing data messages communicated via a RAN. In some aspects, the new protocol layer may be an OCAP layer. In some aspects, the set of data packets may include one of a single IP packet, a plurality of IP packets, a PDU set, or a burst of data including a plurality of PDU sets. For example, referring to FIG. 12, the transmitting device 1203, in some aspects, may, at 1216, generate encoded packets associated with an encoded data transmission based on the application data 1212 and the parity bits generated at 1214.

The set of data packets, in some aspects, may include a first plurality of IP packets and the encoded data transmission may include a second plurality of outer coding packets including a first set of outer coding packets including data associated with a corresponding IP packet in the first plurality of IP packets and a second set of outer coding packets comprising the set of parity bits. In some aspects, generating the encoded data transmission at 1410 includes generating an outer coding header for each of the second plurality of packets, where the outer coding header is associated with a processing at the OCAP layer of the protocol stack. Generating the encoded data transmission at 1410, in some aspects, may include generating a GTP-U header applied after the outer coding header for each of the second plurality of packets, where the GTP-U header is associated with a processing at a one of a PDCP or a SDAP layer of the protocol stack.

In some aspects, the outer coding header includes decoding parameters associated with a FEC operation (to be performed) at the receiving device based on a set of encoding parameters used in generating the encoded data transmission. The decoding parameters, in some aspects, may include one or more of a SBN, an ESI, a transfer length, an encoding symbol length, a number of source blocks, a number of sub-blocks, or a symbol alignment parameter. In some aspects, a PDCP header associated with a PDCP payload including the encoded data transmission indicates whether the outer coding header is included in the PDCP payload (e.g., an SDU).

At 1412, the transmitting device may output, for a receiving device associated with the application, the encoded data transmission. For example, 1412 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. Referring to FIG. 12, for example, the transmitting device 1203 may transmit (or provide) the encoded data 1218 to the NFs and application 1201 (e.g., a RAN 650 of FIG. 6) for transmission to the receiving device 1205 as encoded data 1220.

Figure 15:
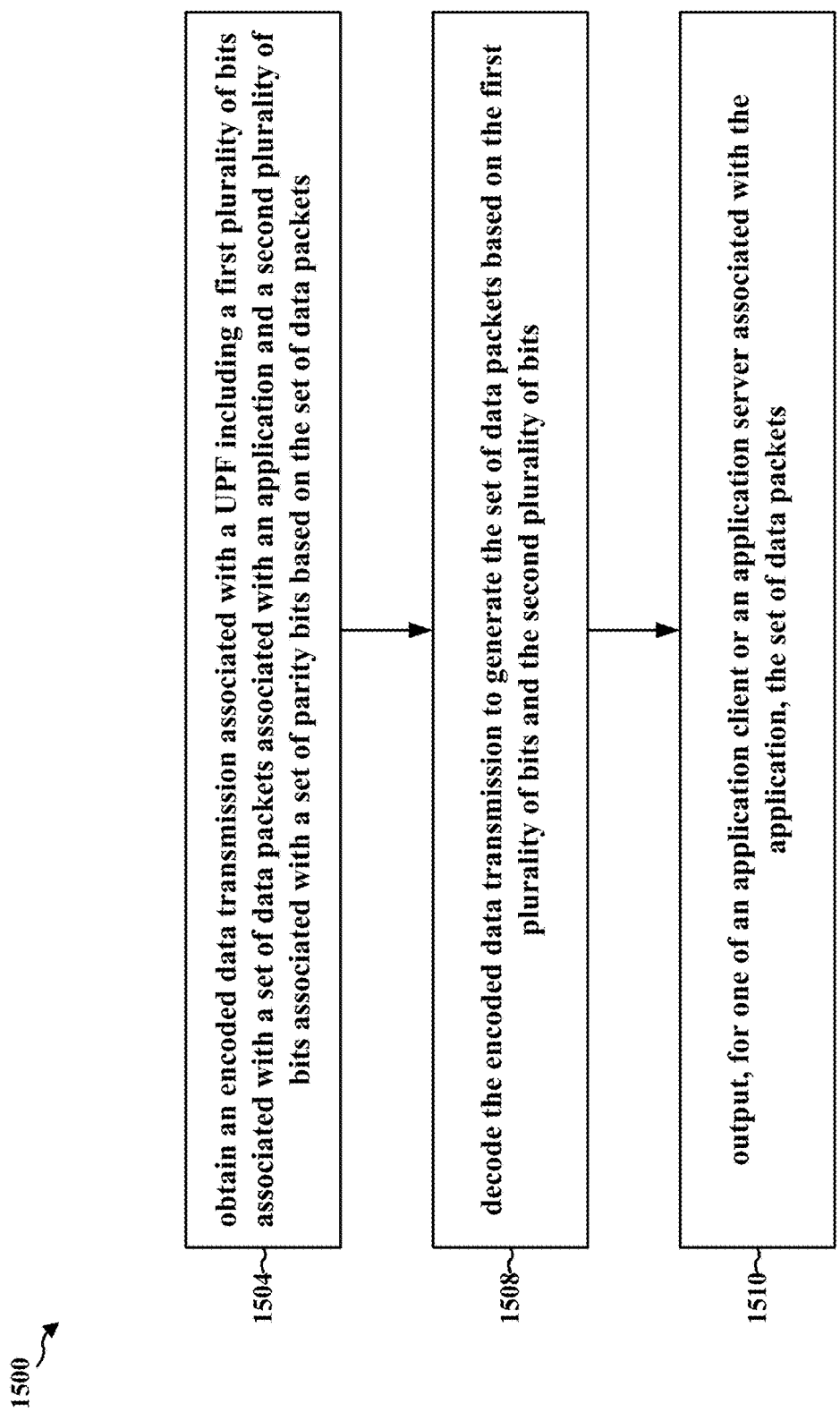
FIG. 15 is a flowchart of a method of wireless communication.

FIG. 15 is a flowchart 1500 of a method of wireless communication. The method may be performed by a UPF (or associated OCF) and/or a UE (e.g., the UE 104, 620, 720; the UPF 610, 710; the receiving device 1205; the apparatus 1704; the network entity 1860). In some aspects, the receiving device is at least one of a UE, a UPF, or an OCF block associated with a core network. The receiving device may output an indication of a capability to decode an encoded data transmission. For example, 1502 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the receiving device may be a UPF and the capability indication may be transmitted to a SMF. The receiving device, in some aspects, may be a wireless device, e.g., a UE, and the capability indication may be output to a core network. For example, referring to FIG. 12, the receiving device 1205, in some aspects, may transmit one or more capability indications 1206 to the NFs and applications 1201 (e.g., an SMF of the NFs and applications 1201) indicating a capability of performing FEC OC.

At 1504, the receiving device may obtain an encoded data transmission associated with a UPF including a first plurality of bits associated with a set of data packets associated with an application and a second plurality of bits associated with a set of parity bits based on the set of data packets. For example, 1504 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. The receiving (network) device, in some aspects, may be a wireless device (e.g., a UE) and the encoded data transmission is an encoded downlink (DL) data transmission. In some aspects, the encoded data transmission is associated with a new protocol layer of a protocol stack for processing data messages communicated via a RAN and the new protocol layer may be an OCAP layer. In some aspects, the set of data packets includes one of a single IP packet, a plurality of IP packets, a PDU set, or a burst of data including a plurality of PDU sets. The set of data packets, in some aspects, may include a first plurality of IP packets and the encoded data transmission may include a second plurality of outer coding packets including a first set of outer coding packets including data associated with a corresponding IP packet in the first plurality of IP packets and a second set of outer coding packets comprising the set of parity bits. In some aspects, the encoded data transmission includes an outer coding header for each of the second plurality of packets and the outer coding header is associated with a processing at the OCAP layer of the protocol stack. In some aspects, the encoded data transmission may include a GTP-U header applied after the outer coding header for each of the second plurality of packets, where the GTP-U header may be associated with a processing at a one of a PDCP or a SDAP layer of the protocol stack. The encoded data transmission, in some aspects, may include an IP header of one or more of the first plurality of the IP packets based on a robust header compression. In some aspects, a PDCP (or SDAP) header associated with a PDCP (or SDAP) payload including the encoded data transmission indicates whether the outer coding header is included in the PDCP (or SDAP) payload. For example, referring to FIG. 12, the receiving device 1205, in some aspects, may receive encoded data 1220.

In some aspects, the receiving device may receive a set of parameters associated with decoding the encoded data transmission. In some aspects, the set of parameters associated with decoding the encoded data transmission may be included in an outer coding header of the encoded data transmission (of packets of the encoded data transmission). The set of parameters, in some aspects, may be associated with an FEC operation at the receiving (network) device and may include one or more of a SBN, an ESI, a transfer length, an encoding symbol length, a number of source blocks, a number of sub-blocks, or a symbol alignment parameter. For example, referring to FIG. 12, the receiving device 1205 may process the encoded data (e.g., at one or more layers associated with one or more headers "outside" the OC header) until reaching the OC header and determining and/or identifying, from the information in the OC header, the OC parameters at 1222.

At 1508, the receiving device may decode the encoded data transmission to generate the set of data packets based on the first plurality of bits and the second plurality of bits. For example, 1508 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of data packets may be associated with a same PDU set or burst of multiple PDU sets associated with a particular application (e.g., an XR application). The parity bits may be used to perform an error correction that avoid a retransmission. For example, referring to FIG. 12, the receiving device 1205 may, at 1224, decode the encoded set of data to produce application data, e.g., IP packets.

At 1510, the receiving device may output, for one of an application client or an application server associated with the application, the set of data packets. For example, 1510 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the receiving device may be a UE and the set of data packets may be output for an application client associated with the UE. The receiving device, in some aspects, may be a UPF (or associated OCF) and the set of data packets may be output for an application server associated with the UPF (or OCF). For example, referring to FIG. 12, the receiving device 1205 may provide the decoded IP packets (decoded application data 1226) to an application or application server in the NFs and applications 1201.

Figure 16:
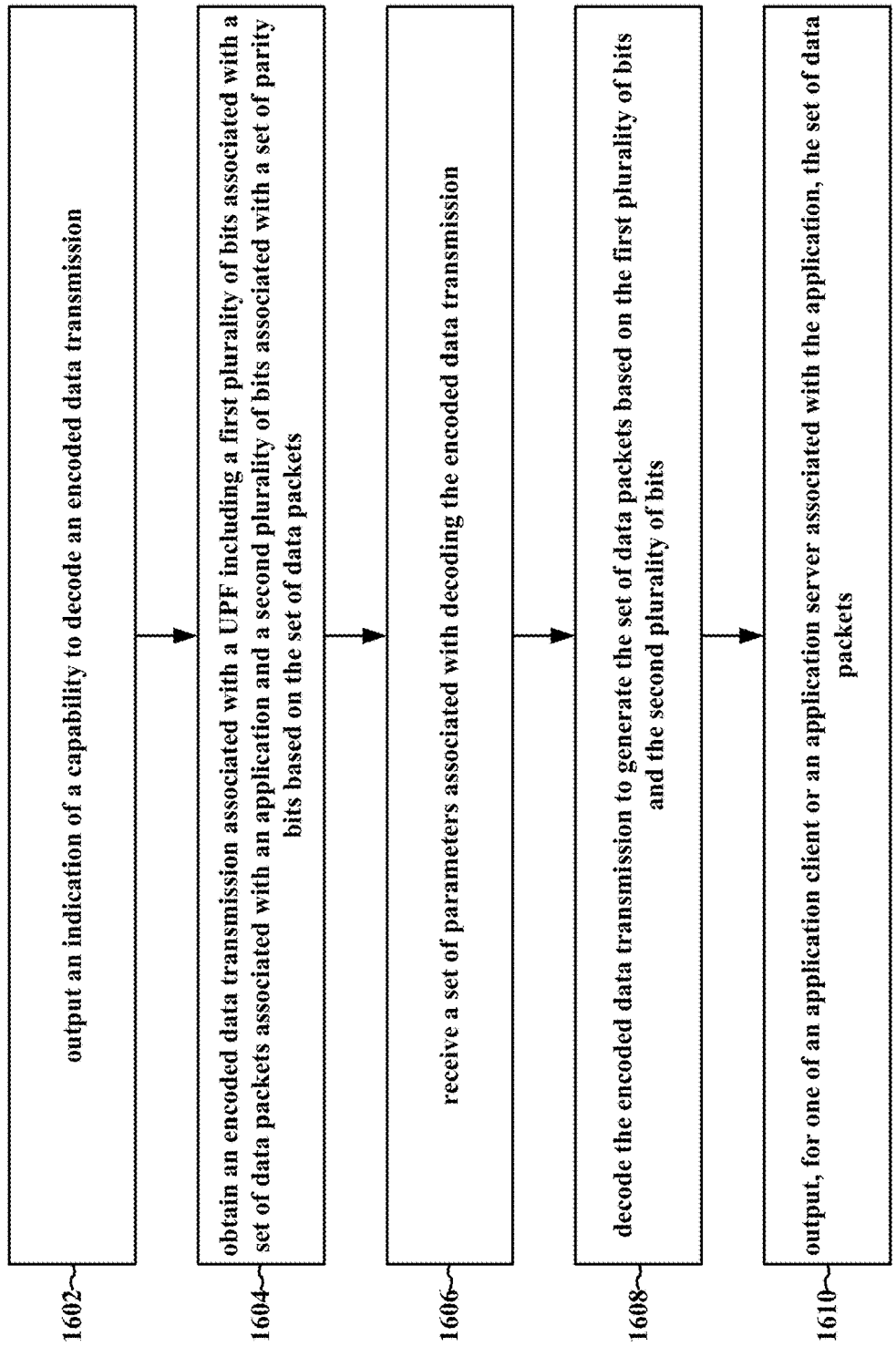
FIG. 16 is a flowchart of a method of wireless communication.

FIG. 16 is a flowchart 1600 of a method of wireless communication. The method may be performed by a UPF (or associated OCF) and/or a UE (e.g., the UE 104, 620, 720; the UPF 610, 710; the receiving device 1205; the apparatus 1704; the network entity 1860). In some aspects, the receiving device is at least one of a UE, a UPF, or an OCF block associated with a core network. At 1602, the receiving device may output an indication of a capability to decode an encoded data transmission. For example, 1602 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the receiving device may be a UPF and the capability indication may be transmitted to a SMF. The receiving device, in some aspects, may be a wireless device, e.g., a UE, and the capability indication may be output to a core network. For example, referring to FIG. 12, the receiving device 1205, in some aspects, may transmit one or more capability indications 1206 to the NFs and applications 1201 (e.g., an SMF of the NFs and applications 1201) indicating a capability of performing FEC OC.

At 1604, the receiving device may obtain an encoded data transmission associated with a UPF including a first plurality of bits associated with a set of data packets associated with an application and a second plurality of bits associated with a set of parity bits based on the set of data packets. For example, 1604 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. The receiving (network) device, in some aspects, may be a wireless device (e.g., a UE) and the encoded data transmission is an encoded downlink (DL) data transmission. In some aspects, the encoded data transmission is associated with a new protocol layer of a protocol stack for processing data messages communicated via a RAN and the new protocol layer may be an OCAP layer. In some aspects, the set of data packets includes one of a single IP packet, a plurality of IP packets, a PDU set, or a burst of data including a plurality of PDU sets. The set of data packets, in some aspects, may include a first plurality of IP packets and the encoded data transmission may include a second plurality of outer coding packets including a first set of outer coding packets including data associated with a corresponding IP packet in the first plurality of IP packets and a second set of outer coding packets comprising the set of parity bits. In some aspects, the encoded data transmission includes an outer coding header for each of the second plurality of packets and the outer coding header is associated with a processing at the OCAP layer of the protocol stack. In some aspects, the encoded data transmission may include a GTP-U header applied after the outer coding header for each of the second plurality of packets, where the GTP-U header may be associated with a processing at a one of a PDCP or a SDAP layer of the protocol stack. The encoded data transmission, in some aspects, may include an IP header of one or more of the first plurality of the IP packets based on a robust header compression. In some aspects, a PDCP (or SDAP) header associated with a PDCP (or SDAP) payload including the encoded data transmission indicates whether the outer coding header is included in the PDCP (or SDAP) payload. For example, referring to FIG. 12, the receiving device 1205, in some aspects, may receive encoded data 1220.

At 1606, receiving device may receive a set of parameters associated with decoding the encoded data transmission. For example, 1606 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of parameters associated with decoding the encoded data transmission may be included in an outer coding header of the encoded data transmission (of packets of the encoded data transmission). The set of parameters, in some aspects, may be associated with an FEC operation at the receiving (network) device and may include one or more of a SBN, an ESI, a transfer length, an encoding symbol length, a number of source blocks, a number of sub-blocks, or a symbol alignment parameter. For example, referring to FIG. 12, the receiving device 1205 may process the encoded data (e.g., at one or more layers associated with one or more headers "outside" the OC header) until reaching the OC header and determining and/or identifying, from the information in the OC header, the OC parameters at 1222.

At 1608, the receiving device may decode the encoded data transmission to generate the set of data packets based on the first plurality of bits and the second plurality of bits. For example, 1608 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the set of data packets may be associated with a same PDU set or burst of multiple PDU sets associated with a particular application (e.g., an XR application). The parity bits may be used to perform an error correction that avoid a retransmission. For example, referring to FIG. 12, the receiving device 1205 may, at 1224, decode the encoded set of data to produce application data, e.g., IP packets.

At 1610, the receiving device may output, for one of an application client or an application server associated with the application, the set of data packets. For example, 1610 may be performed by application processor(s) 1706, cellular baseband processor(s) 1724, transceiver(s) 1722, antenna(s) 1780, FEC outer coding component 198, network processor 1812, network interface 1880, and/or FEC outer coding component 199 of FIGS. 17 and 18. In some aspects, the receiving device may be a UE and the set of data packets may be output for an application client associated with the UE. The receiving device, in some aspects, may be a UPF (or associated OCF) and the set of data packets may be output for an application server associated with the UPF (or OCF). For example, referring to FIG. 12, the receiving device 1205 may provide the decoded IP packets (decoded application data 1226) to an application or application server in the NFs and applications 1201.

Figure 17:
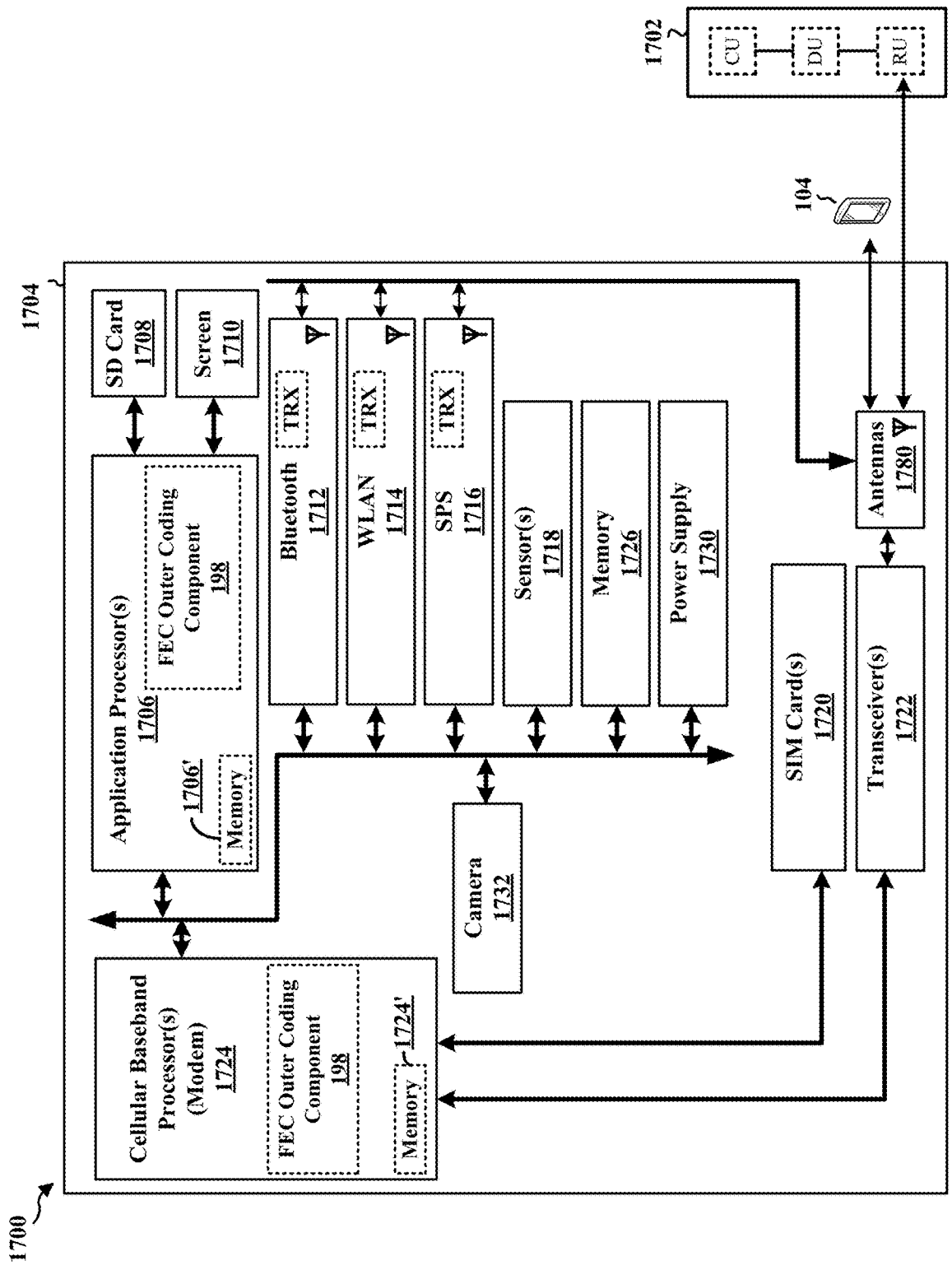
FIG. 17 is a diagram illustrating an example of a hardware implementation for an example apparatus and/or network entity.

FIG. 17 is a diagram 1700 illustrating an example of a hardware implementation for an apparatus 1704. The apparatus 1704 may be a UE, a component of a UE, or may implement UE functionality. In some aspects, the apparatus 1704 may include at least one cellular baseband processor 1724 (also referred to as a modem) coupled to one or more transceivers 1722 (e.g., cellular RF transceiver). The cellular baseband processor(s) 1724 may include at least one on-chip memory 1724'. In some aspects, the apparatus 1704 may further include one or more subscriber identity modules (SIM) cards 1720 and at least one application processor 1706 coupled to a secure digital (SD) card 1708 and a screen 1710. The application processor(s) 1706 may include on-chip memory 1706'. In some aspects, the apparatus 1704 may further include a Bluetooth module 1712, a WLAN module 1714, an SPS module 1716 (e.g., GNSS module), one or more sensor modules 1718 (e.g., barometric pressure sensor/altimeter; motion sensor such as inertial measurement unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), additional memory modules 1726, a power supply 1730, and/or a camera 1732. The Bluetooth module 1712, the WLAN module 1714, and the SPS module 1716 may include an on-chip transceiver (TRX) (or in some cases, just a receiver (RX)). The Bluetooth module 1712, the WLAN module 1714, and the SPS module 1716 may include their own dedicated antennas and/or utilize one or more antennas 1780 for communication. The cellular baseband processor(s) 1724 communicates through the transceiver(s) 1722 via the one or more antennas 1780 with the UE 104 and/or with an RU associated with a network entity 1702. The cellular baseband processor(s) 1724 and the application processor(s) 1706 may each include a computer-readable medium/memory 1724', 1706', respectively. The additional memory modules 1726 may also be considered a computer-readable medium/memory. Each computer-readable medium/memory 1724', 1706', 1726 may be non-transitory. The cellular baseband processor(s) 1724 and the application processor(s) 1706 are each responsible for general processing, including the execution of software stored on the computer-readable medium/memory. The software, when executed by the cellular baseband processor(s) 1724/application processor(s) 1706, causes the cellular baseband processor(s) 1724/application processor(s) 1706 to perform the various functions described supra. The computer-readable medium/memory may also be used for storing data that is manipulated by the cellular baseband processor(s) 1724/application processor(s) 1706 when executing software. The cellular baseband processor(s) 1724/application processor(s) 1706 may be a component of the UE 350 and may include the at least one memory 360 and/or at least one of the TX processor 368, the RX processor 356, and the controller/processor 359. In one configuration, the apparatus 1704 may be at least one processor chip (modem and/or application) and include just the cellular baseband processor(s) 1724 and/or the application processor(s) 1706, and in another configuration, the apparatus 1704 may be the entire UE (e.g., see UE 350 of FIG. 3) and include the additional modules of the apparatus 1704.

As discussed supra, the FEC outer coding component 198 may be configured to generate, for a set of data packets associated with an application, a set of parity bits and generate an encoded data transmission associated with a UPF including the set of data packets and the generated set of parity bits. The FEC outer coding component 198 may further be configured to output, for a receiving device associated with the application, the encoded data transmission. The FEC outer coding component 198 may be within the cellular baseband processor(s) 1724, the application processor(s) 1706, or both the cellular baseband processor(s) 1724 and the application processor(s) 1706. The FEC outer coding component 198 may be one or more hardware components specifically configured to carry out the stated processes/algorithm, implemented by one or more processors configured to perform the stated processes/algorithm, stored within a computer-readable medium for implementation by one or more processors, or some combination thereof. When multiple processors are implemented, the multiple processors may perform the stated processes/algorithm individually or in combination. As shown, the apparatus 1704 may include a variety of components configured for various functions. In one configuration, the apparatus 1704, and in particular the cellular baseband processor(s) 1724 and/or the application processor(s) 1706, may include means for outputting an indication of a capability to generate the encoded data transmission. The apparatus 1704, and in particular the cellular baseband processor(s) 1724 and/or the application processor(s) 1706, may include means for receiving a set of parameters associated with the generation of the encoded data transmission from a RAN network device via at least one of directly from the RAN network device or a SMF and an AMF. The apparatus 1704, and in particular the cellular baseband processor(s) 1724 and/or the application processor(s) 1706, may include means for identifying a set of parameters associated with a generation of the encoded UL data transmission. The apparatus 1704, and in particular the cellular baseband processor(s) 1724 and/or the application processor(s) 1706, may include means for transmitting, to a RAN network device, an indication of the set of parameters. The apparatus 1704, and in particular the cellular baseband processor(s) 1724 and/or the application processor(s) 1706, may include means for generating, for a set of data packets associated with an application, a set of parity bits. The apparatus 1704, and in particular the cellular baseband processor(s) 1724 and/or the application processor(s) 1706, may include means for generating an encoded data transmission associated with a UPF comprising the set of data packets and the generated set of parity bits. The apparatus 1704, and in particular the cellular baseband processor(s) 1724 and/or the application processor(s) 1706, may include means for generating a GTP-U header applied after the outer coding header for each of the second plurality of packets. The apparatus 1704, and in particular the cellular baseband processor(s) 1724 and/or the application processor(s) 1706, may include means for performing a robust header compression on an IP header of the first plurality of IP packets before an application of the outer coding header. The apparatus 1704, and in particular the cellular baseband processor(s) 1724 and/or the application processor(s) 1706, may include means for generating the set of parity bits based on the first plurality of IP packets including an IP header. The apparatus 1704, and in particular the cellular baseband processor(s) 1724 and/or the application processor(s) 1706, may include means for generating the set of parity bits based on a payload of each of the first plurality of IP packets excluding the IP header. The apparatus 1704, and in particular the cellular baseband processor(s) 1724 and/or the application processor(s) 1706, may include means for outputting, for a receiving device associated with the application, the encoded data transmission. The apparatus 1704, and in particular the cellular baseband processor(s) 1724 and/or the application processor(s) 1706, may include means for outputting an indication of a capability to decode the encoded data transmission. The apparatus 1704, and in particular the cellular baseband processor(s) 1724 and/or the application processor(s) 1706, may include means for receiving a set of parameters associated with decoding the encoded data transmission. The apparatus 1704, and in particular the cellular baseband processor(s) 1724 and/or the application processor(s) 1706, may include means for obtaining an encoded data transmission associated with a UPF comprising a first plurality of bits associated with a set of data packets associated with an application and a second plurality of bits associated with a set of parity bits based on the set of data packets. The apparatus 1704, and in particular the cellular baseband processor(s) 1724 and/or the application processor(s) 1706, may include means for decoding the encoded data transmission to generate the set of data packets based on the first plurality of bits and the second plurality of bits. The apparatus 1704, and in particular the cellular baseband processor(s) 1724 and/or the application processor(s) 1706, may include means for outputting, for one of an application client or an application server associated with the application, the set of data packets. The means may be the FEC outer coding component 198 of the apparatus 1704 configured to perform the functions recited by the means. As described supra, the apparatus 1704 may include the TX processor 368, the RX processor 356, and the controller/processor 359. As such, in one configuration, the means may be the TX processor 368, the RX processor 356, and/or the controller/processor 359 configured to perform the functions recited by the means or as described in relation to FIGS. 13 to 16.

Figure 18:
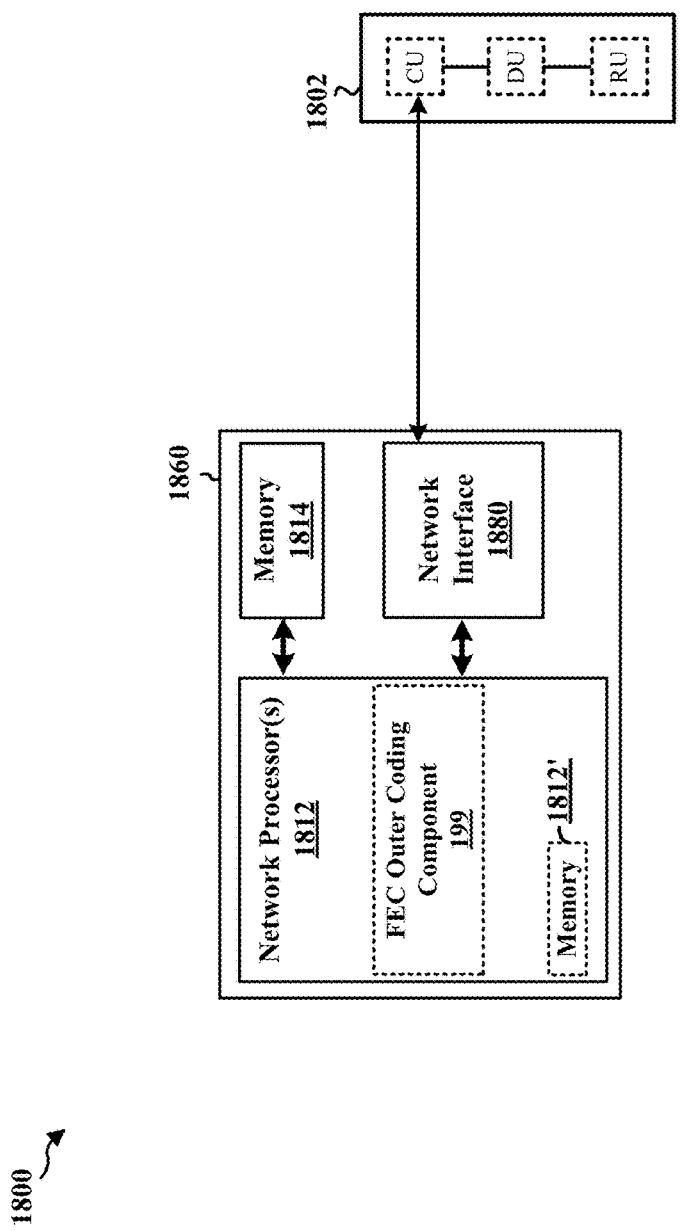
FIG. 18 is a diagram illustrating an example of a hardware implementation for an example network entity.

FIG. 18 is a diagram 1800 illustrating an example of a hardware implementation for a network entity 1860. In one example, the network entity 1860 may be within the core network 120. The network entity 1860 may include at least one network processor 1812. The network processor(s) 1812 may include on-chip memory 1812'. In some aspects, the network entity 1860 may further include additional memory modules 1814. The network entity 1860 communicates via the network interface 1880 directly (e.g., backhaul link) or indirectly (e.g., through a RIC) with the CU 1802. The on-chip memory 1812' and the additional memory modules 1814 may each be considered a computer-readable medium/memory. Each computer-readable medium/memory may be non-transitory. The network processor(s) 1812 is responsible for general processing, including the execution of software stored on the computer-readable medium/memory. The software, when executed by the corresponding processor(s) causes the processor(s) to perform the various functions described supra. The computer-readable medium/memory may also be used for storing data that is manipulated by the processor(s) when executing software.

As discussed supra, the FEC outer coding component 199 that may be configured to obtain an encoded data transmission associated with a UPF including a first plurality of bits associated with a set of data packets associated with an application and a second plurality of bits associated with a set of parity bits based on the set of data packets. The FEC outer coding component 199 may further be configured to decode the encoded data transmission to generate the set of data packets based on the first plurality of bits and the second plurality of bits and output, for one of an application client or an application server associated with the application, the set of data packets. The FEC outer coding component 199 may be within the network processor(s) 1812. The FEC outer coding component 199 may be one or more hardware components specifically configured to carry out the stated processes/algorithm, implemented by one or more processors configured to perform the stated processes/algorithm, stored within a computer-readable medium for implementation by one or more processors, or some combination thereof. When multiple processors are implemented, the multiple processors may perform the stated processes/algorithm individually or in combination. The network entity 1860 may include a variety of components configured for various functions. In one configuration, the network entity 1860 may include means for outputting an indication of a capability to generate the encoded data transmission. The network entity 1860 may include means for receiving a set of parameters associated with the generation of the encoded data transmission from a RAN network device via at least one of directly from the RAN network device or a SMF and an AMF. The network entity 1860 may include means for identifying a set of parameters associated with a generation of the encoded UL data transmission. The network entity 1860 may include means for transmitting, to a RAN network device, an indication of the set of parameters. The network entity 1860 may include means for generating, for a set of data packets associated with an application, a set of parity bits. The network entity 1860 may include means for generating an encoded data transmission associated with a UPF comprising the set of data packets and the generated set of parity bits. The network entity 1860 may include means for generating a GTP-U header applied after the outer coding header for each of the second plurality of packets. The network entity 1860 may include means for performing a robust header compression on an IP header of the first plurality of IP packets before an application of the outer coding header. The network entity 1860 may include means for generating the set of parity bits based on the first plurality of IP packets including an IP header. The network entity 1860 may include means for generating the set of parity bits based on a payload of each of the first plurality of IP packets excluding the IP header. The network entity 1860 may include means for outputting, for a receiving device associated with the application, the encoded data transmission. The network entity 1860 may include means for outputting an indication of a capability to decode the encoded data transmission. The network entity 1860 may include means for receiving a set of parameters associated with decoding the encoded data transmission. The network entity 1860 may include means for obtaining an encoded data transmission associated with a UPF comprising a first plurality of bits associated with a set of data packets associated with an application and a second plurality of bits associated with a set of parity bits based on the set of data packets. The network entity 1860 may include means for decoding the encoded data transmission to generate the set of data packets based on the first plurality of bits and the second plurality of bits. The network entity 1860 may include means for outputting, for one of an application client or an application server associated with the application, the set of data packets. The means may be the FEC outer coding component 199 of the network entity 1860 configured to perform the functions recited by the means or as described in relation to FIGS. 13 to 16.

To avoid retransmission latency caused by feedback (e.g., HARQ or ARQ based retransmission) for latency-important XR traffic, this disclosure proposes outer coding with redundant parity symbols to ensure reliable and timely transmissions for XR traffic.

In some aspects of wireless communication, particular applications may have tight latency and/or power consumption thresholds. For example, an extended reality (XR) application may be associated with a PDU set or burst to be delivered within a tight delay budget (e.g., 10 ms) and with a power consumption (e.g., <1 W) of augmented reality (AR) glasses. For such applications, one or more retransmissions (e.g., associated with an automatic repeat request (ARQ), or hybrid ARQ (HARQ)) may be used to correct a detected packet error, but the retransmission may increase the latency and/or the power consumption due to its long turn-around time (e.g., TMO Sub-6: HARQ turn-around time≈7 ms; radio link control (RLC) reTx≈35 ms). Forward error correction (FEC) outer coding, in some aspects, may be used to avoid a retransmission procedure by transmitting redundant parity symbols. By avoiding retransmissions, the use of FEC may thus improve the latency and/or the power consumption. In some aspects, this FEC outer coding utilizes radio area network (RAN) related information to optimize the performance. Accordingly, applying an outer coding at the RAN may be a straightforward design option, however, a 5G RAN, in some aspects, may have limited capacity such that it would be hard to process the FEC outer coding due to its limited processing capability.

In some aspects of wireless communication, some applications may be associated with data transmitted in groups of data packets (e.g., groups of internet protocol (IP) packets). For example, an XR application may consume data in packet data unit (PDU) sets that may be associated with a smallest unit of data for the XR application and may be further grouped into a burst of PDU sets that may be associated with a same threshold time. For example, a burst of PDU sets may be associated with a single video frame or slice of a video frame that are used at a same time (e.g., the threshold time).

Various aspects relate generally to an FEC outer coding applied at a UPF. Some aspects more specifically relate to FEC coding for a PDU set or a burst of PDU sets. In some examples, a transmitting device may for a set of data packets associated with an application, generate a set of parity bits, generate an encoded data transmission associated with a UPF including the set of data packets and the generated set of parity bits and may output, for a receiving device associated with the application, the encoded data transmission. A receiving device may obtain the encoded data transmission associated with the UPF including a first plurality of bits associated with a set of data packets associated with an application and a second plurality of bits associated with a set of parity bits based on the set of data packets, decode the encoded data transmission to generate the set of data packets based on the first plurality of bits and the second plurality of bits and output the set of data packets for one of an application client or an application server associated with the application.

Particular aspects of the subject matter described in this disclosure can be implemented to realize one or more of the following potential advantages. In some examples, by applying the FEC outer coding in association with a UPF, the described techniques can be used to improve latency and/or power consumption (e.g., for an XR application).

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A. B. and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C. B and C, or A and B and C, where any such combinations may contain one or more member or members of A, B, or C. Sets should be interpreted as a set of elements where the elements number one or more. Accordingly, for a set of X, X would include one or more elements. When at least one processor is configured to perform a set of functions, the at least one processor, individually or in any combination, is configured to perform the set of functions. Accordingly, each processor of the at least one processor may be configured to perform a particular subset of the set of functions, where the subset is the full set, a proper subset of the set, or an empty subset of the set. If a first apparatus receives data from or transmits data to a second apparatus, the data may be received/transmitted directly between the first and second apparatuses, or indirectly between the first and second apparatuses through a set of apparatuses. A device configured to "output" data, such as a transmission, signal, or message, may transmit the data, for example with a transceiver, or may send the data to a device that transmits the data. A device configured to "obtain" data, such as a transmission, signal, or message, may receive, for example with a transceiver, or may obtain the data from a device that receives the data. Information stored in a memory includes instructions and/or data. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The following aspects are illustrative only and may be combined with other aspects or teachings described herein, without limitation.

Aspect 1 is a method of wireless communication at a network device, comprising: generating, for a set of data packets associated with an application, a set of parity bits; generating an encoded data transmission associated with a user plane function (UPF) comprising the set of data packets and the generated set of parity bits; and outputting, for a receiving device associated with the application, the encoded data transmission.

Aspect 2 is the method of aspect 1, further comprising: receiving a set of parameters associated with the generation of the encoded data transmission from a radio access network (RAN) network device via at least one of directly from the RAN network device or a session management function (SMF) and an access and mobility function (AMF).

Aspect 3 is the method of aspect 2, wherein the set of parameters comprises at least one of: outer coding encoding parameters for the encoded data transmission, wherein the outer coding encoding parameters comprise at least one of an indication of an outer code type, a symbol size, a number of parity symbols, or a number of symbols for which to generate the encoded data transmission; or information related to the RAN network device for determining the outer coding encoding parameters for the encoded data transmission, wherein the information related to the RAN network device comprises at least one of a number of blocks, an average size of a transport block, a target error rate, or a burst error rate.

Aspect 4 is the method of aspect 1, wherein the network device is a wireless device and the encoded data transmission is an encoded uplink (UL) data transmission for decoding at the UPF, the method further comprising: identifying a set of parameters associated with a generation of the encoded UL data transmission; and transmitting, to a radio access network (RAN) network device, an indication of the set of parameters.

Aspect 5 is the method of any of aspects 1 to 4, wherein the encoded data transmission is associated with a new protocol layer of a protocol stack for processing data messages communicated via a radio access network (RAN), wherein the new protocol layer comprises an outer coding adaptation protocol (OCAP) layer.

Aspect 6 is the method of aspect 5, wherein the set of data packets comprises one of a single internet protocol (IP) packet, a plurality of IP packets, a packet data unit (PDU) set, or a burst of data comprising a plurality of PDU sets.

Aspect 7 is the method of aspect 5, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein generating the encoded data transmission comprises generating an outer coding header for each of the second plurality of outer coding packets, wherein the outer coding header is associated with a processing at the OCAP layer of the protocol stack.

Aspect 8 is the method of aspect 7, wherein generating the encoded data transmission further comprises at least one of: generating a general packet radio service (GPRS) tunneling protocol user plane (GTP-U) header applied after the outer coding header for each of the second plurality of packets, wherein the GTP-U header is associated with a processing at a packet data convergence protocol (PDCP) layer of the protocol stack; or performing a robust header compression on an IP header of the first plurality of IP packets before an application of the outer coding header.

Aspect 9 is the method of any of aspects 7 and 8, wherein the outer coding header comprises decoding parameters associated with a forward error correction (FEC) operation at the receiving device based on a set of encoding parameters used in generating the encoded data transmission, wherein the decoding parameters comprise one or more of a source block number (SBN), an encoding symbol identifier (ID) (ESI), a transfer length, an encoding symbol length, a number of source blocks, a number of sub-blocks, or a symbol alignment parameter.

Aspect 10 is the method of any of aspects 7 to 9, wherein a packet data convergence protocol (PDCP) header associated with a PDCP payload including the encoded data transmission indicates whether the outer coding header is included in the PDCP payload.

Aspect 11 is the method of any of aspects 7 to 10, wherein generating the set of parity bits comprises one of: generating the set of parity bits based on the first plurality of IP packets including an IP header, wherein the first set of outer coding packets comprises the outer coding header and a payload comprising an IP packet of the first plurality of IP packets; or generating the set of parity bits based on a payload of each of the first plurality of IP packets excluding the IP header, wherein the second plurality of outer coding packets comprises the IP header and an outer coding payload comprising the outer coding header and a set of bits based on the payload of one or more of the first plurality of IP packets.

Aspect 12 is the method of any of aspects 1 to 11, further comprising: outputting an indication of a capability to generate the encoded data transmission, wherein generating the encoded data transmission is based on a capacity of the receiving device to decode the encoded data transmission.

Aspect 13 is the method of any of aspects 1 to 3 and 5 to 12, wherein the network device is at least one of the UPF or an outer coding function block associated with a core network.

Aspect 14 is a method of wireless communication at a network device, comprising: obtaining an encoded data transmission associated with a user plane function (UPF) comprising a first plurality of bits associated with a set of data packets associated with an application and a second plurality of bits associated with a set of parity bits based on the set of data packets; decoding the encoded data transmission to generate the set of data packets based on the first plurality of bits and the second plurality of bits; and outputting, for one of an application client or an application server associated with the application, the set of data packets.

Aspect 15 is the method of aspect 14, further comprising: receiving a set of parameters associated with decoding the encoded data transmission.

Aspect 16 is the method of aspect 15, wherein the set of parameters associated with decoding the encoded data transmission is included in an outer coding header, wherein the set of parameters is associated with a forward error correction (FEC) operation at the network device, wherein the set of parameters comprise one or more of a source block number (SBN), an encoding symbol identifier (ID) (ESI), a transfer length, an encoding symbol length, a number of source blocks, a number of sub-blocks, or a symbol alignment parameter.

Aspect 17 is the method of any of aspects 14 to 16, wherein the network device is a wireless device and the encoded data transmission is an encoded downlink (DL) data transmission.

Aspect 18 is the method of any of aspects 14 to 17, wherein the encoded data transmission is associated with a new protocol layer of a protocol stack for processing data messages communicated via a radio access network (RAN), wherein the new protocol layer comprises an outer coding adaptation protocol (OCAP) layer.

Aspect 19 is the method of any of aspects 14 to 18, wherein the set of data packets comprises one of a single internet protocol (IP) packet, a plurality of IP packets, a packet data unit (PDU) set, or a burst of data comprising a plurality of PDU sets.

Aspect 20 is the method of any of aspects 14 to 18, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein the encoded data transmission comprises an outer coding header for each of the second plurality of packets, wherein the outer coding header is associated with a processing at an outer coding adaptation protocol (OCAP) layer of a protocol stack.

Aspect 21 is the method of aspect 20, wherein the encoded data transmission further comprises at least one of: a general packet radio service (GPRS) tunneling protocol user plane (GTP-U) header applied after the outer coding header for each of the second plurality of packets, wherein the GTP-U header is associated with a processing at a packet data convergence protocol (PDCP) layer of the protocol stack; or an IP header of one or more of the first plurality of IP packets based on a robust header compression.

Aspect 22 is the method of any of aspects 20 and 21, wherein a packet data convergence protocol (PDCP) header associated with a PDCP payload including the encoded data transmission indicates whether the outer coding header is included in the PDCP payload.

Aspect 23 is the method of any of aspects 14 to 22, further comprising: outputting an indication of a capability to decode the encoded data transmission, wherein receiving the encoded data transmission is based on a capacity of a transmitting device to generate the encoded data transmission.

Aspect 24 is an apparatus for wireless communication at a device including a memory and at least one processor coupled to the memory and, based at least in part on information stored in the memory, the at least one processor is configured to implement any of aspects 1 to 13.

Aspect 25 is the apparatus of aspect 24, further including a transceiver or an antenna coupled to the at least one processor.

Aspect 26 is an apparatus for wireless communication at a device including means for implementing any of aspects 1 to 13.

Aspect 27 is a computer-readable medium (e.g., a non-transitory computer-readable medium) storing computer executable code, where the code when executed by a processor causes the processor to implement any of aspects 1 to 13.

Aspect 28 is an apparatus for wireless communication at a device including a memory and at least one processor coupled to the memory and, based at least in part on information stored in the memory, the at least one processor is configured to implement any of aspects 14 to 23.

Aspect 29 is the apparatus of aspect 28, further including a transceiver or an antenna coupled to the at least one processor.

Aspect 30 is an apparatus for wireless communication at a device including means for implementing any of aspects 14 to 23.

Aspect 31 is a computer-readable medium (e.g., a non-transitory computer-readable medium) storing computer executable code, where the code when executed by a processor causes the processor to implement any of aspects 14 to 23.

What is claimed is:

1. An apparatus for wireless communication at a network device, comprising:
   at least one memory; and
   at least one processor coupled to the at least one memory and, based at least in part on stored information that is stored in the at least one memory, the at least one processor, individually or in any combination, is configured to:
      generate, for a set of data packets associated with an application, a set of parity bits;
      generate an encoded data transmission associated with a user plane function (UPF) comprising the set of data packets and the generated set of parity bits; and
      output, for a receiving device associated with the application, the encoded data transmission.

2. The apparatus of claim 1, wherein the at least one processor, individually or in any combination, is further configured to:
   receive a set of parameters associated with generating the encoded data transmission from a radio access network (RAN) network device via at least one of directly from the RAN network device or a session management function (SMF) and an access and mobility function (AMF).

3. The apparatus of claim 2, wherein the set of parameters comprises at least one of:
  outer coding encoding parameters for the encoded data transmission, wherein the outer coding encoding parameters comprise at least one of an indication of an outer code type, a symbol size, a number of parity symbols, or a number of symbols for which to generate the encoded data transmission; or
  information related to the RAN network device for determining the outer coding encoding parameters for the encoded data transmission, wherein the information related to the RAN network device comprises at least one of a number of blocks, an average size of a transport block, a target error rate, or a burst error rate.

4. The apparatus of claim 1, wherein the network device is a wireless device and the encoded data transmission is an encoded uplink (UL) data transmission for decoding at the UPF, wherein the at least one processor, individually or in any combination, is further configured to:
  identify a set of parameters associated with a generation of the encoded UL data transmission; and
  transmit, to a radio access network (RAN) network device, an indication of the set of parameters.

5. The apparatus of claim 1, wherein the encoded data transmission is associated with a new protocol layer of a protocol stack for processing data messages communicated via a radio access network (RAN), wherein the new protocol layer comprises an outer coding adaptation protocol (OCAP) layer.

6. The apparatus of claim 5, wherein the set of data packets comprises one of a single internet protocol (IP) packet, a plurality of IP packets, a packet data unit (PDU) set, or a burst of data comprising a plurality of PDU sets.

7. The apparatus of claim 5, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein to generate the encoded data transmission the at least one processor, individually or in any combination, is configured to generate an outer coding header for each of the second plurality of outer coding packets, wherein the outer coding header is associated with a processing at the OCAP layer of the protocol stack.

8. The apparatus of claim 7, wherein to generate the encoded data transmission the at least one processor, individually or in any combination, is configured to at least one of:
  generate a general packet radio service (GPRS) tunneling protocol user plane (GTP-U) header applied after the outer coding header for each of the second plurality of packets, wherein the GTP-U header is associated with a processing at a packet data convergence protocol (PDCP) layer of the protocol stack; or
  perform a robust header compression on an IP header of the first plurality of IP packets before an application of the outer coding header.

9. The apparatus of claim 7, wherein the outer coding header comprises decoding parameters associated with a forward error correction (FEC) operation at the receiving device based on a set of encoding parameters used in generating the encoded data transmission, wherein the decoding parameters comprise one or more of a source block number (SBN), an encoding symbol identifier (ID) (ESI), a transfer length, an encoding symbol length, a number of source blocks, a number of sub-blocks, or a symbol alignment parameter.

10. The apparatus of claim 7, wherein a packet data convergence protocol (PDCP) header associated with a PDCP payload including the encoded data transmission indicates whether the outer coding header is included in the PDCP payload.

11. The apparatus of claim 7, wherein to generate the set of parity bits the at least one processor, individually or in any combination, is configured to one of:
  generate the set of parity bits based on the first plurality of IP packets including an IP header, wherein the first set of outer coding packets comprises the outer coding header and a payload comprising an IP packet of the first plurality of IP packets; or
  generate the set of parity bits based on a payload of each of the first plurality of IP packets excluding the IP header, wherein the second plurality of outer coding packets comprises the IP header and an outer coding payload comprising the outer coding header and a set of bits based on the payload of one or more of the first plurality of IP packets.

12. The apparatus of claim 1, wherein the at least one processor, individually or in any combination, is further configured to:
  output an indication of a capability to generate the encoded data transmission, wherein generating the encoded data transmission is based on a capacity of the receiving device to decode the encoded data transmission.

13. The apparatus of claim 1, wherein the network device is at least one of the UPF or an outer coding function block associated with a core network.

14. An apparatus for wireless communication at a network device, comprising:
  at least one memory; and
  at least one processor coupled to the at least one memory and, based at least in part on stored information that is stored in the at least one memory, the at least one processor, individually or in any combination, is configured to:
    obtain an encoded data transmission associated with a user plane function (UPF) comprising a first plurality of bits associated with a set of data packets associated with an application and a second plurality of bits associated with a set of parity bits based on the set of data packets;
    decode the encoded data transmission to generate the set of data packets based on the first plurality of bits and the second plurality of bits; and
    output, for one of an application client or an application server associated with the application, the set of data packets.

15. The apparatus of claim 14, wherein the at least one processor, individually or in any combination, is further configured to:
  receive a set of parameters associated with decoding the encoded data transmission.

16. The apparatus of claim 15, wherein the set of parameters associated with decoding the encoded data transmission is included in an outer coding header, wherein the set of parameters is associated with a forward error correction (FEC) operation at the network device, wherein the set of parameters comprise one or more of a source block number (SBN), an encoding symbol identifier (ID) (ESI), a transfer length, an encoding symbol length, a number of source blocks, a number of sub-blocks, or a symbol alignment parameter.

17. The apparatus of claim 14, wherein the network device is a wireless device and the encoded data transmission is an encoded downlink (DL) data transmission.

18. The apparatus of claim 14, wherein the encoded data transmission is associated with a new protocol layer of a protocol stack for processing data messages communicated via a radio access network (RAN), wherein the new protocol layer comprises an outer coding adaptation protocol (OCAP) layer.

19. The apparatus of claim 14, wherein the set of data packets comprises one of a single internet protocol (IP) packet, a plurality of IP packets, a packet data unit (PDU) set, or a burst of data comprising a plurality of PDU sets.

20. The apparatus of claim 14, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein the encoded data transmission comprises an outer coding header for each of the second plurality of packets, wherein the outer coding header is associated with a processing at an outer coding adaptation protocol (OCAP) layer of a protocol stack.

21. The apparatus of claim 20, wherein the encoded data transmission further comprises at least one of:
a general packet radio service (GPRS) tunneling protocol user plane (GTP-U) header applied after the outer coding header for each of the second plurality of packets, wherein the GTP-U header is associated with a processing at a packet data convergence protocol (PDCP) layer of the protocol stack; or
an IP header of one or more of the first plurality of IP packets based on a robust header compression.

22. The apparatus of claim 20, wherein a packet data convergence protocol (PDCP) header associated with a PDCP payload including the encoded data transmission indicates whether the outer coding header is included in the PDCP payload.

23. The apparatus of claim 14, wherein the at least one processor, individually or in any combination, is further configured to:
output an indication of a capability to decode the encoded data transmission, wherein the at least one processor, individually or in any combination, is configured to receive the encoded data transmission based on a capacity of a transmitting device to generate the encoded data transmission.

24. A method of wireless communication at a network device, comprising:
generating, for a set of data packets associated with an application, a set of parity bits;
generating an encoded data transmission associated with a user plane function (UPF) comprising the set of data packets and the generated set of parity bits; and
outputting, for a receiving device associated with the application, the encoded data transmission.

25. The method of claim 24, wherein the network device is at least one of the UPF or an outer coding function block associated with a core network, the method further comprising receiving a set of parameters associated with the generation of the encoded data transmission, wherein the set of parameters comprises at least one of:

outer coding encoding parameters for the encoded data transmission, wherein the outer coding encoding parameters comprise at least one of an indication of an outer code type, a symbol size, a number of parity symbols, or a number of symbols for which to generate the encoded data transmission; or
information related to a radio access network (RAN) network device for determining the outer coding encoding parameters for the encoded data transmission, wherein the information related to the RAN network device comprises at least one of a number of blocks, an average size of a transport block, a target error rate, or a burst error rate.

26. The method of claim 24, wherein the encoded data transmission is associated with a new protocol layer of a protocol stack for processing data messages communicated via a radio access network (RAN), wherein the new protocol layer comprises an outer coding adaptation protocol (OCAP) layer.

27. The method of claim 26, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein generating the encoded data transmission comprises generating an outer coding header for each of the second plurality of outer coding packets, wherein the outer coding header is associated with a processing at the OCAP layer of the protocol stack.

28. A method of wireless communication at a network device, comprising:
obtaining an encoded data transmission associated with a user plane function (UPF) comprising a first plurality of bits associated with a set of data packets associated with an application and a second plurality of bits associated with a set of parity bits based on the set of data packets;
decoding the encoded data transmission to generate the set of data packets based on the first plurality of bits and the second plurality of bits; and
outputting, for one of an application client or an application server associated with the application, the set of data packets.

29. The method of claim 28, further comprising receiving a set of parameters associated with decoding the encoded data transmission, wherein the set of parameters associated with decoding the encoded data transmission is included in an outer coding header, wherein the set of parameters is associated with a forward error correction (FEC) operation at the network device, wherein the set of parameters comprise one or more of a source block number (SBN), an encoding symbol identifier (ID) (ESI), a transfer length, an encoding symbol length, a number of source blocks, a number of sub-blocks, or a symbol alignment parameter.

30. The method of claim 28, wherein the encoded data transmission is associated with a new protocol layer of a protocol stack for processing data messages communicated via a radio access network (RAN), wherein the new protocol layer comprises an outer coding adaptation protocol (OCAP) layer, wherein the set of data packets comprises a first plurality of internet protocol (IP) packets and the encoded data transmission comprises a second plurality of outer coding packets comprising a first set of outer coding packets including data associated with a corresponding IP packet in the first plurality of IP packets and a second set of outer coding packets comprising the set of parity bits, wherein the encoded data transmission comprises an outer coding header for each of the second plurality of outer coding packets, and wherein the outer coding header is associated with a processing at the OCAP layer of the protocol stack.

* * * * *